US011109515B1

(12) United States Patent
Nagarajan et al.

(10) Patent No.: US 11,109,515 B1
(45) Date of Patent: Aug. 31, 2021

(54) HEATSINK FOR CO-PACKAGED OPTICAL SWITCH RACK PACKAGE

(71) Applicant: INPHI CORPORATION, Santa Clara, CA (US)

(72) Inventors: Radhakrishnan L. Nagarajan, Santa Clara, CA (US); Liang Ding, Singapore (SG); Mark Patterson, Santa Clara, CA (US); Roberto Coccioli, Santa Clara, CA (US); Steve Aboagye, Santa Clara, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

(21) Appl. No.: 16/894,639

(22) Filed: Jun. 5, 2020

(51) Int. Cl.
*H05K 7/20* (2006.01)
*G02B 6/42* (2006.01)
*H01L 23/427* (2006.01)
*H01L 25/16* (2006.01)
*H04Q 11/00* (2006.01)
*G02B 6/43* (2006.01)

(52) U.S. Cl.
CPC ......... *H05K 7/20672* (2013.01); *G02B 6/428* (2013.01); *G02B 6/4269* (2013.01); *G02B 6/43* (2013.01); *H01L 23/427* (2013.01); *H01L 25/167* (2013.01); *H04Q 11/0005* (2013.01); *H05K 7/2039* (2013.01); *H05K 7/20154* (2013.01); *H05K 7/20572* (2013.01)

(58) Field of Classification Search
CPC ............. H05K 7/2039; H05K 7/20572; H05K 7/20672; G02B 6/4269; G02B 6/428; G02B 6/43; H01L 23/427; H01L 25/167; H04Q 11/0005
See application file for complete search history.

(56) References Cited

U.S. PATENT DOCUMENTS

| | | | |
|---|---|---|---|
| 6,189,601 B1 * | 2/2001 | Goodman ........... | F28D 15/0233 165/104.33 |
| 6,680,848 B2 * | 1/2004 | Petit .................... | H01L 23/4006 361/704 |
| 6,746,261 B2 * | 6/2004 | Petit ....................... | H05K 7/023 361/704 |
| 6,840,311 B2 * | 1/2005 | Ghosh ................. | F28D 15/0233 165/104.33 |
| 7,032,305 B2 * | 4/2006 | Petit .................... | H01L 23/4006 29/832 |

(Continued)

*Primary Examiner* — Robert J Hoffberg

(57) ABSTRACT

An integrated heatsink for a co-packaged optical-electrical module includes a base plate attached on top of a co-packaged optical-electrical module. The integrated heatsink further includes a plurality of fin structures extended upward from the base plate except a central cavity region with missing sections of fins, each fin extended along an axial direction from a front edge to a back edge of the base plate except some trenches shallow in depth across some fin structures and some other trenches deep in depth down to the base plate either along or across some fin structures. Additionally, the integrated heatsink includes multiple heat pipes including shaped portions embedded in the trenches in the plurality of fin structures. At least one bottom horizontal portion per heat pipe is brazed to the base plate in a corresponding region that is superimposed on hot spots of the co-packaged optical-electrical module under the base plate.

19 Claims, 19 Drawing Sheets

(56) References Cited

U.S. PATENT DOCUMENTS

2007/0047206 A1*   3/2007   Lee .................... H01L 23/467
                                                 361/703
2007/0169919 A1*   7/2007   Deng ................. H01L 23/427
                                                 165/104.33

* cited by examiner

HEATSINK FOR CO-PACKAGED OPTICAL SWITCH RACK PACKAGE

CROSS-REFERENCE TO RELATED APPLICATIONS

This application is commonly assigned to Inphi Corp. with U.S. Ser. No. 16/894,597, filed concurrently on Jun. 5, 2020, U.S. Ser. No. 16/894,611, filed concurrently on Jun. 5, 2020, and U.S. Ser. No. 16/894,622, filed concurrently on Jun. 5, 2020, which are incorporated by reference herein for all purposes.

BACKGROUND OF THE INVENTION

The present invention relates to optical telecommunication techniques. More particularly, the present invention provides an integrated heatsink apparatus and a method for dissipating heat of co-packaged optical-electrical switch module with a switch processor chip mounted with multiple light engine chiplets on a compact switch substrate loaded in a rack chassis with extra-short-reach or equivalent protocol for data interconnect operation.

As science and technology are updated rapidly, processing speed and capacity of the computer increase correspondingly. The communication transmission or reception using the traditional cable is limited to bandwidth and transmission speed of the traditional cable and mass information transmission required in modern life causes the traditional communication transmission overload. To correspond to such requirement, the optical fiber transmission system replaces the traditional communication transmission system gradually. The optical fiber communication is chosen for systems requiring higher bandwidth and longer distance that electrical cable cannot accommodate. Present electronic industrial performs research toward optical transmission which will become the mainstream in the future even for short distance communication. Said optical communication is a technology in that light wave functions as signal carrier and transmitted between two nodes via the optical fiber. An optical communication system includes an optical transmitter and an optical receiver. By the optical transceiver, the received optical signal can be converted to an electrical signal capable of being processed by an IC, or the processed electrical signal can be converted to the optical signal to be transmitted via optical fiber. Therefore, objective of communication can be achieved.

Over the last few decades, the use of communication networks exploded. In the early days Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs.

40-Gbit/s and then 100-Gbit/s data rates wide-band WDM (Wavelength Division Multiplexed) optical transmission over existing single-mode fiber is a target for the next generation of fiber-optic communication networks. More recently, optical components are being integrated on silicon (Si) substrates for fabricating large-scale silicon photonics integrated circuits that co-exist with micro-electronic chips. Chip-scale lasers packaged directly within silicon photonics opto-electrical system have been of interest for many applications such as wide-band DWDM or CWDM communication and wavelength-steered light detection. A whole range of photonic components, including filters, (de)multiplexers, splitters, modulators, and photodetectors, have been demonstrated, mostly in the silicon-on-insulator (SOI) platform. The SOI platform is especially suited for standard DWDM communication bands around 1550 nm or CWDM communication band around 1310 nm, as silicon (n=3.48) and its oxide $SiO_2$ (n=1.44) are both transparent, and form high-index contrast, high-confinement waveguides ideally suited for medium to high-integration planar integrated circuits (PICs).

With the advances of optical communication technology and applications driven by the market, the demands become stronger on increasing bandwidth for optical communication and decreasing package footprint of an optical transceiver. It is more and more challenging to integrate all necessary components within smaller and smaller module package. For the state-of-art optical transceiver products, all the critical components including clock data recovery (CDRs), modulator drivers, transimpedance amplifiers (TIAs), and PLC photonics blocks having optical passives, modulators, and photo detectors, are assembled side-by-side on a same SOI-based component substrate in a 2 D fashion. This approach has at least two drawbacks for developing any future optical transceiver with data rate greater than 400 G. Firstly, the side-by-side placement of the components consumes much of the board area for optical transceiver as a pluggable product or major substrate area for on-board optics product, making it very difficult to further shrink the product size. Secondly, side-by-side placement on the substrate creates longer electrical transmission length and often requires wire bonds between electrical die and photonics die, introducing more electrical loss which damages signal integrity for very high data rate transceiver product, e.g., >56 Gbaud symbol rate. In particular, the wire bonds lead to impedance mismatch due to large inductance, degrading the signal at higher frequencies. As such, it is not practical to use wirebond as electrical interconnect between chips or between chips and board for the applications where high frequency (e.g., >40 GHz) analog signal is transmitted. The large inductance of wire bonds has become a bottle neck of high-speed data transmission.

With the advancement of silicon TSV manufacturing process for making Si photonics components and integrating active components with wafer-level assembly and burn-in testing, a co-packaged optical-electrical system that assembles an optical-electrical processor chip on a compact module substrate in very short interconnect length with multiple light engines with efficient thermal dissipation design would provide great high-performance benefit and desired bandwidth capacity for various applications involving backplane reach, or medium reach, or short reach, or extra-short reach interconnect switch for high-speed data communication.

BRIEF SUMMARY OF THE INVENTION

The present invention relates to optical telecommunication techniques. More particularly, the present invention provides a co-packaged optical-electrical module with a switch processor and multiple light engine chiplets mounted on a same switch substrate. Merely by example, the present invention discloses a light engine made from a photonics sub-module of multi-channel optical-electrical transceivers integrated on a single silicon photonics substrate in-packaged with multiple lasers to provide multiple CWDM channels carrying total 1.6 Tbit/s or higher capacity per light engine, a method for fixing a compact chiplet package of the light engine on the switch substrate and releasing the chiplet package therefrom, though other applications are possible.

In modern electrical interconnect systems, high-speed serial links have replaced parallel data buses, and serial link speed is rapidly increasing due to the evolution of CMOS technology. Internet bandwidth doubles almost every two years following Moore's Law. But Moore's Law is coming to an end in the next decade. Standard CMOS silicon transistors will stop scaling around 3 nm. And the internet bandwidth increasing due to process scaling will plateau. But Internet and mobile applications continuously demand a huge amount of bandwidth for transferring photo, video, music, and other multimedia files. This disclosure describes techniques and methods to improve the communication bandwidth beyond Moore's law.

In an embodiment, the present invention provides an in-packaged multi-channel light engine. The in-packaged multi-channel light engine includes four or more sub-assemblies of optical-electrical sub-modules. Each sub-assembly is assembled in a case formed with a lid member covering a peripheral side member over peripheral edge region of a sub-module substrate. Each optical-electrical sub-module includes at least four laser chips, one or more driver chips, and one or more trans-impedance amplifier (TIA) chips separately flip-mounted on a silicon photonics substrate and is coupled to an optical interface block and an electrical interface block commonly mounted on the corresponding sub-module substrate. The in-packaged multi-channel light engine further includes a first frame fixture with a crossly-joined bar across middle region to form four or more window structures configured to allow the four or more sub-assemblies to be fitted in respectively with top surfaces of the lid members on top and bottom sides of the corresponding sub-module substrates at bottom. Additionally, the in-packaged multi-channel light engine includes a second frame fixture configured to hold the first frame fixture with the four or more sub-assemblies. The in-packaged multi-channel light engine further includes an interposer plate having a top side with four or more first-sets of conducting bumps, a bottom side with four or more second-sets of patterned conducting bumps, and a plurality of through-plate conducting vias and interior conducting paths configured to connect the first-sets of conducting bumps with the four or more second-sets of patterned conducting bumps. Each first-set of conducting bumps is configured to bond to a respective sub-module substrate. Furthermore, the in-packaged multi-channel light engine includes a module substrate having a top side with four or more sets of conducting bump contacts configured to respectively bond to the four or more second-sets of conducting bumps. The in-packaged multi-channel light engine further includes a backplate member attached to a bottom side of the module substrate. Moreover, the in-packaged multi-channel light engine includes a top plate member configured to compress the second frame fixture that holds the first frame fixture with the four or more sub-assemblies, the interposer plate, and the module substrate vertically together with the backplate member. The top plate member is configured as a heatsink with a plurality of fin structures.

In a specific embodiment, the present invention provides a sub-assembly of a multi-channel light engine. The sub-assembly includes a sub-module substrate severed as a bottom member and a peripheral frame member having four sides disposed along a peripheral region on a front surface of the sub-module substrate. The peripheral frame member has an open slot through at least one side. The sub-assembly further includes a silicon photonics substrate electrically bonded via through-substrate vias bump contacts on the front surface of the sub-module substrate. The silicon photonics substrate is configured to fabricate multiple Si-based waveguide devices therein. Additionally, the sub-assembly includes one or more driver chips, one or more transimpedance amplifier chips, and multiple laser chips separately mounted on the silicon photonics substrate and coupled to corresponding Si-based waveguide devices to form a transmitter unit and a receiver unit. The sub-assembly further includes an optical interface block containing multiple planar waveguides formed on a glass substrate mounted on the front surface of the sub-module substrate next to the silicon photonics substrate. The multiple planar waveguides are optically coupled to corresponding Si-based waveguide devices and optical fibers in a fiber cable laid through the open slot through the at least one side. The optical interface block is configured to deliver output transmitted from the transmitter unit to an output optical fiber and to receive incoming multi-wavelength light signal from an input optical fiber for the receiver unit. Furthermore, the sub-assembly includes an electrical interface block including multiple ASIC chips mounted on the front surface of the sub-module substrate or a back surface thereof and configured to receive data signals based on which control signals for the laser chips are generated for producing multi-channel optical signals and process digital signals converted from the incoming light signal for electrical host. Moreover, the sub-assembly includes a top lid member covering the peripheral frame member to enclose the light engine.

In an alternative embodiment, the present disclosure provides a packaged chiplet of a multi-channel light engine. The packaged chiplet includes a lid member connected with a periphery member having one side with a socket port. Additionally, the packaged chiplet includes a sub-module substrate having a peripheral region configured to be attached with the periphery member to form an enclosure with the lid member. Furthermore, the packaged chiplet includes a first die comprising an application-specific integrated circuit (ASIC) chip configured to at least serve as a digital signal processing (DSP) interface. Moreover, the packaged chiplet includes a second die comprising a silicon photonics chip including Si-based waveguide devices coupled to multiple laser chips to respectively provide multiple different wavelengths for multiple channels of an optical transceiver. The second die is electrically coupled and physically stacked with the first die in the enclosure.

In another alternative embodiment, the present disclosure provides a co-packaged optical-electrical module. The co-packaged optical-electrical module includes a module substrate with a minimum lateral dimension no greater than 100 mm. Additionally, the co-packaged optical-electrical module includes a main die with a processor chip disposed at a central region of the module substrate. The processor chip being configured to operate with a digital-signal processing (DSP) interface for extra-short-reach data interconnect. Furthermore, the co-packaged optical-electrical module includes a plurality of chiplet dies disposed densely along a peripheral region of the module substrate. Each chiplet die is configured to be self-packaged light engine on a sub-module substrate with a minimum lateral dimension to allow a maximum number of chiplet dies on the module substrate with a distance of any chiplet die from the main die smaller than 50 mm for extra-short-reach interconnect operation.

In yet another alternative embodiment, the present disclosure provides a packaged light engine. The packaged light engine includes a sub-assembly having a lid member connected with a periphery member configured as a front edge with an optical connector port, two opposing side edges with ledge structures, and a back edge opposing to the front edge. The sub-assembly further includes a sub-module substrate having a peripheral region configured to support the periphery member to form an enclosure with the lid member. Additionally, the sub-assembly includes a first die comprising an application-specific integrated circuit (ASIC) chip configured to at least serve as a digital signal processing (DSP) interface. Moreover, the sub-assembly includes a second die comprising a silicon photonics chip including Si-based waveguide devices coupled to multiple laser chips to respectively provide multiple different wavelengths for multiple channels of an optical transceiver. The second die is electrically coupled and physically stacked with the first die in the enclosure. The packaged light engine further includes an interposer pad disposed under the sub-module substrate. Additionally, the packaged light engine includes a socket base member having a flat plate connected to a peripheral wall structure having at least a front wall configured with at least two separated bottom notches and a back wall opposing to the front wall with one connected bottom notch and two side walls connected to the front wall and the back wall. The flat plate is recessed to receive the interposer pad and then the sub-module substrate as a part of the sub-assembly in an orientation with the optical connector port protruded out of a cutoff portion of the front wall. Moreover, the packaged light engine includes a shaped metal wire having a horizontal backside section fitted in the connected bottom notch in the back wall, two horizontal side sections pressed respectively on the ledge structures within the two side walls, and two end sections locked respectively in the two separated bottom notches in the front wall, and several bended sections for connecting the horizontal backside section, the two horizontal side sections, and the two end sections and providing elastic forces on the ledge structures to clamp the sub-assembly in the socket base member.

In still another alternative embodiment, the present disclosure provides a method for co-packaging multiple light engines in a switch module. The method includes a step of providing a module substrate with a minimum lateral dimension no greater than 110 mm. The module substrate is configured with a first mounting site at a center region and a plurality of second mounting sites distributed densely along peripheral region of the module substrate. Additionally, the method includes a step of disposing a main die with a switch processor chip at the first mounting site of the module substrate. The switch processor chip is configured to operate with a digital-signal processing (DSP) interface for extra-short-reach or equivalent interconnect. Furthermore, the method includes a step of mounting a plurality of chiplet dies respectively into the plurality of second mounting sites of the module substrate. Each chiplet die is configured to be a packaged light engine with a minimum lateral dimension to allow a maximum number of chiplet dies co-packaged on the module substrate with a distance of any chiplet die from the main die smaller than 50 mm for extra-short-reach interconnect operation.

In yet another alternative embodiment, the present disclosure provides an integrated heatsink for a co-packaged optical-electrical module. The integrated heatsink includes a base plate attached on top of a co-packaged optical-electrical module including a processor ASIC chip at a central region of a switch substrate with multiple light engine chiplets commonly mounted along peripheral edges of the same switch substrate. The base plate is center-aligned with the central region of the switch substrate and edge-extended parallelly beyond the peripheral edges of the switch substrate in all directions. Additionally, the integrated heatsink includes a plurality of fin structures extended upward from the base plate except a central cavity region with missing sections of fins. Each fin has a fin-plane extended along an axial direction from a front edge to a back edge of the base plate except some trenches shallow in depth across some fin structures and some other trenches deep in depth down to the base plate either along or across some fin structures. Furthermore, the integrated heatsink includes multiple thermal conductors embedded in the trenches in the plurality of fin structures. Each thermal conductor includes a pair of top horizontal portions laid in corresponding trenches shallow in depth across some fin structures, at least one bottom horizontal portion laid in the central cavity region of the base plate or in corresponding trenches deep in depth down to the base plate along or across some fin structures, and a pair of vertical portions to connect the pair of top horizontal portions and the at least bottom horizontal portion. The at least one bottom horizontal portion is brazed to the base plate in a corresponding region that is superimposed on either the processor ASIC chip at the central region of the switch substrate or the multiple light engine chiplets mounted along one of peripheral edges of the switch substrate.

In still another alternative embodiment, the present disclosure provides a switch module in a rack unit package based on co-packaged optics. The switch module includes a rack chassis with a bottom plate extended from a front side to a back side. The switch module further includes multiple sets of optical connector sockets installed on the front side. Additionally, the switch module includes multiple electrically powered fans installed on the back side and configured to generate a forced air flow from the front side to the back side with a certain flow rate. The switch module further includes a co-packaged optical-electrical module including a processor ASIC chip at a central region of a switch substrate with multiple light engine chiplets commonly mounted along peripheral edges of the same switch substrate mounted on the bottom plate. Furthermore, the switch module includes a base plate attached on top of the co-packaged optical-electrical module. The base plate is center-aligned with the central region of the switch substrate and edge-extended parallelly beyond the peripheral edges of the switch substrate in all directions. The switch module further includes a plurality of fin structures extended upward from the base plate except a central cavity region with missing sections of fins. Each fin has a fin-plane extended along an axial direction from a front edge to a back edge of the base plate except some trenches shallow in depth across some fin structures and some other trenches deep in depth down to the base plate either along or across some fin structures. Moreover, the switch module includes multiple thermal conductors embedded in the trenches in the plurality of fin structures. Each thermal conductor includes a pair of top horizontal portions laid in corresponding trenches shallow in depth across some fin structures, at least one bottom horizontal portion laid in the central cavity region of the base plate or in corresponding trenches deep in depth down to the base plate along or across some fin structures, and a pair of vertical portions to connect the pair of top horizontal portions and the at least bottom horizontal portion. The at least one bottom horizontal portion is brazed to the base plate in a corresponding region that is superimposed on either the processor ASIC chip at the central region of the switch substrate or the multiple light engine chiplets mounted along one of peripheral edges of the switch substrate.

In yet still another alternative embodiment, the present disclosure provides a method of cooling an optical-electrical switch in a rack package. The method includes providing a rack chassis with a bottom plate extended from a front side to a back side. The method further includes installing multiple optical conductor sockets on the front side. Additionally, the method includes installing multiple electrical-powered fans on the back side to generate a forced air flow from the front side to the back side in the rack chassis. The method further includes mounting a co-packaged optical-electrical module on the bottom plate. The co-packaged optical-electrical module includes a processor ASIC chip at a central region of a switch substrate with multiple light engine chiplets commonly mounted along peripheral edges of the same switch substrate. The switch substrate is coupled to a power supply in the rack chassis. Furthermore, the method includes disposing an integrated heatsink on top of the co-packaged optical-electrical module in the rack chassis. The integrated heatsink includes a base plate attached to the top of the co-packaged optical-electrical module. The base plate being center-aligned with the central region of the switch substrate and edge-extended parallelly beyond the peripheral edges of the switch substrate in all directions. The integrated heatsink further includes a plurality of fin structures extended upward from the base plate except a central cavity region with missing sections of fins. Each fin has a fin-plane extended along an axial direction from a front edge to a back edge of the base plate except some trenches shallow in depth across some fin structures and some other trenches deep in depth down to the base plate either along or across some fin structures. The integrated heatsink further includes multiple thermal conductors embedded in the trenches in the plurality of fin structures. Each thermal conductor includes a pair of top horizontal portions laid in corresponding trenches shallow in depth across some fin structures, at least one bottom horizontal portion laid in the central cavity region of the base plate or in corresponding trenches deep in depth down to the base plate along or across some fin structures, and a pair of vertical portions to connect the pair of top horizontal portions and the at least bottom horizontal portion. The at least one bottom horizontal portion is brazed to the base plate in a corresponding region that is superimposed on either the processor ASIC chip at the central region of the switch substrate or the multiple light engine chiplets mounted along one of peripheral edges of the switch substrate.

The present invention achieves these benefits and others in the context of known waveguide laser modulation technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

Figure 1:
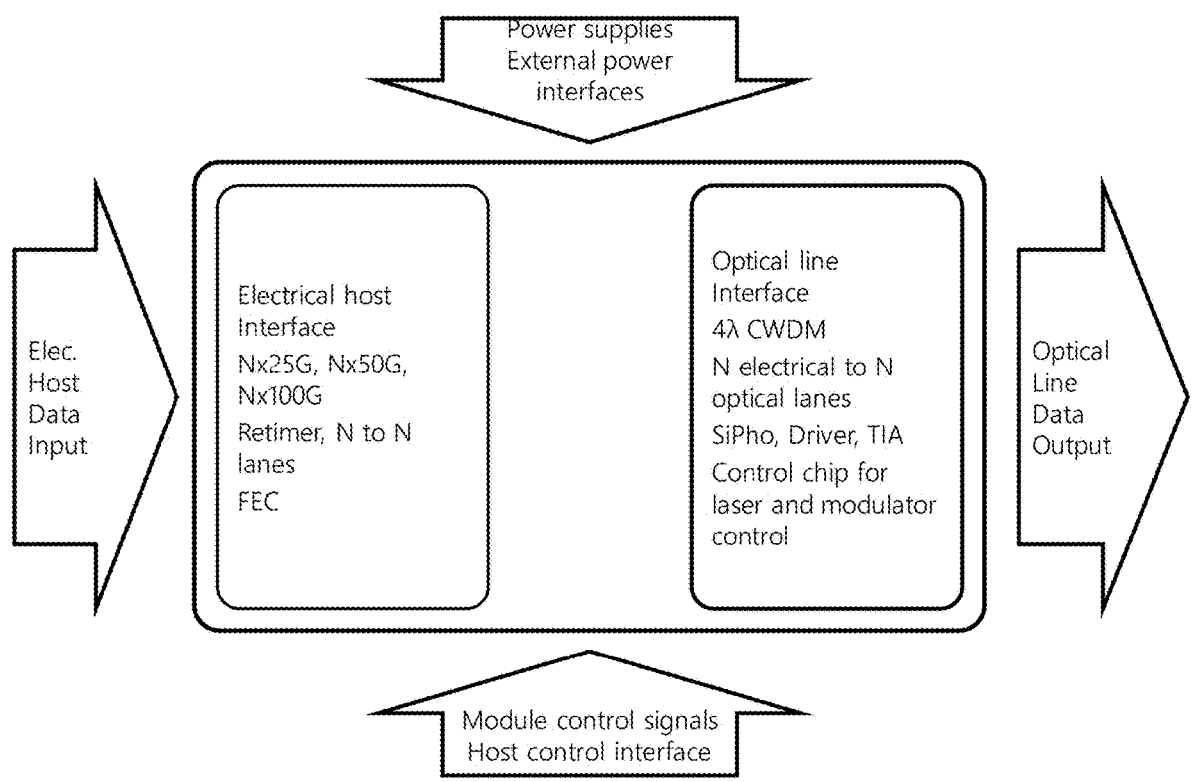
FIG. 1 is a simplified block diagram of an integrated optical-electrical sub-module according to an embodiment of the present invention.

The present invention relates to optical telecommunication techniques. More particularly, the present invention provides an in-packaged optical-electrical module assembling multiple sub-modules on a single line card, each being configured as a multi-channel light engine containing an optical-electrical transceiver based on silicon-photonics platform. Merely by example, the present invention discloses a sub-assembly for the sub-module integrating 4 laser chips providing 4 CWDM channels plus 4 optional replicated CWDM channels on a single silicon photonics substrate, a compact package for multiple such sub-assemblies of sub-modules on a single line card providing 0.4 Tbit/s or higher per sub-module for building desired switching capacity in various applications of high-speed data communication with different interconnect lengths, though other applications are possible.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter-clockwise have been used for convenience purposes only and are not intended to imply any particular fixed direction. Instead, they are used to reflect relative locations and/or directions between various portions of an object.

In an aspect, the present disclosure provides an integrated optical-electrical sub-module based on silicon photonics platform and an in-packaged optics assembly of four sub-modules on one module substrate with 1.6 Tbit/s or higher optical lane speeds for PAM backplane/optical reach for various interconnect ranges of data communication. As data transmission-capacities increase in WDM systems, demand on high-speed, compact optical transceiver based on silicon photonics platform increasingly attract more and more interest over the recent years. For example, a pluggable optical transceiver in compact form factor. Yet, the compact optical transceiver is still a stand-alone device that needs to be coupled with separate passive optical devices like Mux/Demux and one or more gear box or retimer chips to connect with an electrical switch device to form a functional light engine, which requires a fairly large package size and high power-consumption.

FIG. 1 shows a simplified block diagram of an integrated optical-electrical sub-module according to an embodiment of the present invention. This diagram is merely an example, which should not unduly limit the scope of the claims. One of ordinary skill in the art would recognize many variations, alternatives, and modifications. As shown, in an embodiment, the integrated optical-electrical sub-module includes an electrical host interface configured to receive electrical host data input via N 25 G (NRZ) or 50 G (PAM4) or 100 G (PAM4) channels and a digital processor to process the data signals via retimer chip having N to N lanes. Optionally, the digital processor processes the data signal via a gear box N to M lanes where N is a multiple of M. Optionally, the electrical host interface is configured in one or more chips including forward error correction (FEC) channel coding for controlling errors in data transmission over unreliable or noisy communication channels. In the embodiment, the integrated optical-electrical sub-module also includes an optical line interface configured with 4-wavelength CWDM lasers modulated to convert N electrical data into optical signals in N optical lanes. Optionally, a light engine with similar configuration can be formed with >4 wavelengths. Optionally, the 4 or more wavelengths may be chosen to have half spacing than nominal CWDM channels. The optical signals are transmitted via optical line data output multiplexed in a waveguide or optical fiber. Optionally, the laser chips, a Driver chip, and a Transimpedance Amplifier (TIA) chip are integrated on a silicon photonics substrate. Optionally, the silicon photonics substrate is mounted via an interposer on a same sub-module substrate for mounting the one or more chips containing the electrical host interface. Optionally, the silicon photonics substrate is the interposer. Optionally, an analog control chip for laser and modulator control is mounted on a backside of the sub-module substrate. Optionally, TIA chip or Driver chip or microcontroller chip can be mounted on the backside of the sub-module substrate as well. Optionally, the integrated optical-electrical sub-module is configured to have an external power interface to couple with a power supply and receive module control signals via a host control interface such as I2C interface.

Figure 2:
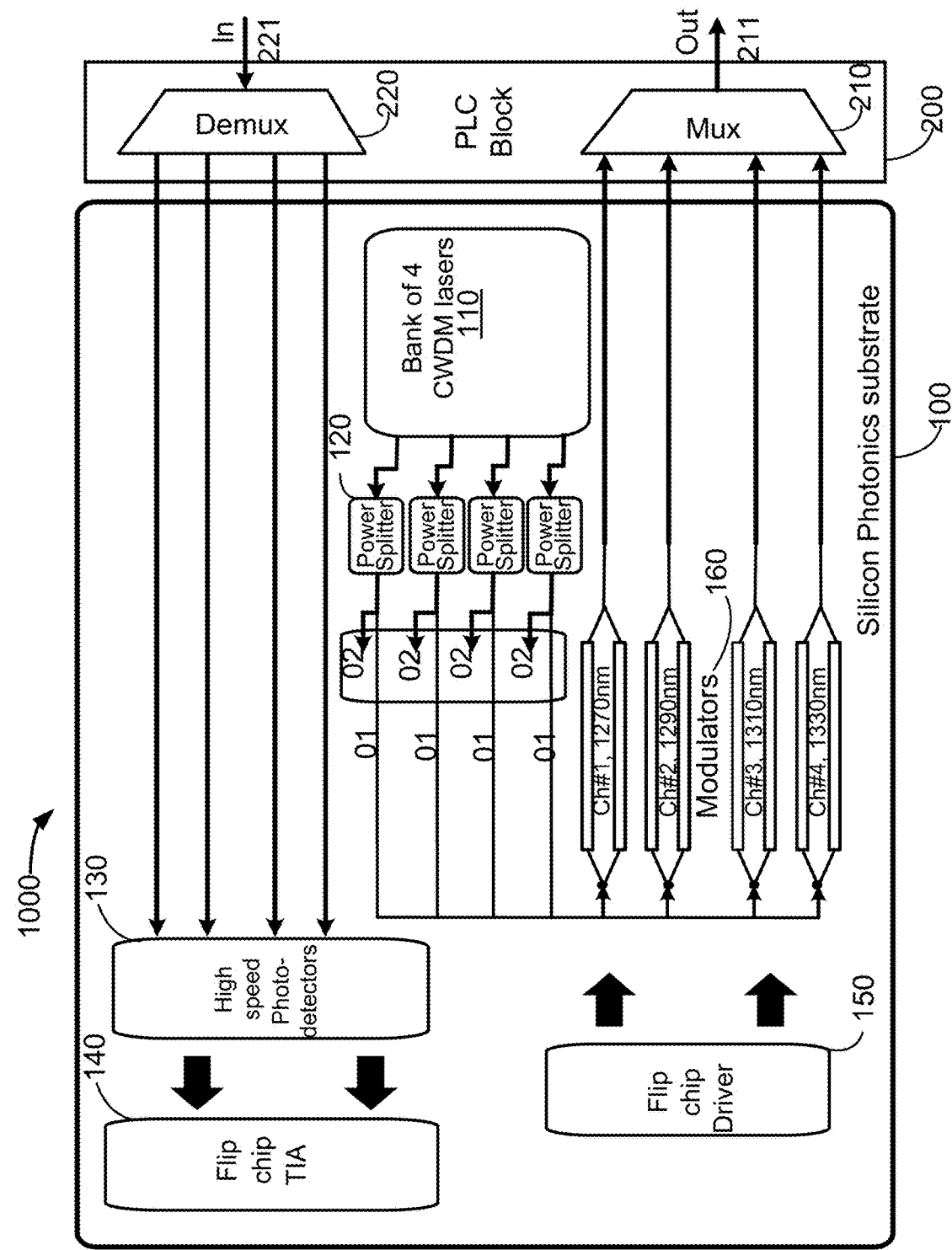
FIG. 2 is an exemplary diagram of an optical-electrical transceiver integrating 4 lasers providing 4 CWDM channels plus 4 replicate channels according to an embodiment of the present invention.

FIG. 2 is an exemplary diagram of an optical-electrical transceiver integrating 4 lasers providing 4 CWDM channels plus 4 replicate channels according to an embodiment of the present invention. This diagram is merely an example, which should not unduly limit the scope of the claims. One of ordinary skill in the art would recognize many variations, alternatives, and modifications. In an embodiment, the optical-electrical transceiver 1000 integrates four laser chips 110 with a driver chip 150 and a TIA chip 140 flip-bonded on a silicon photonics (SiPho) substrate 100 to form a SiPho chip coupled with an external planar light circuit (PLC) block 200. As shown, the optical-electrical transceiver 1000 is specifically configured as a 4-wavelength CWDM optical transceiver including an optical receive path and an optical transmit path. In the optical receive path, it is configured to receive incoming four light signals with four wavelengths demultiplexed from one optical input 221. In the optical transmit path, it is configured to output four light signals with four CWDM channel wavelengths multiplexed to one optical output 211. A 4-to-1 multiplexer (Mux) 210 is a PLC waveguide device formed on a glass or sapphire substrate and configured to multiplex the four CWDM channel wavelengths into one waveguide or optical fiber. A 1-to-4 demultiplexer (Demux) 220 is another PLC waveguide device formed on the same glass or sapphire substrate and configured to demultiplex an incoming optical signal to four multiplexed wavelengths which carry high-speed modulated signals from the network. The optical-electrical transceiver 1000 also includes multiple high-speed photodetectors 130 to detect each of the four light signals with four demultiplexed wavelengths. In the embodiment, both the Mux 210 and Demux 220 are integrated in the PLC block 200. Optionally, the PLC block 200 includes multiple optical waveguides formed in a single glass or sapphire substrate aligned with corresponding waveguides in the silicon photonics substrate 100.

Referring to FIG. 2, the optical-electrical transceiver 1000 includes a bank of 4 CWDM lasers 110 respectively provide 4 light signals with respective CWDM channel wavelengths centered in 1270 nm, 1290 nm, 1310 nm, and 1330 nm. Optionally, each laser device is a DFB laser chip. Optionally, each laser chip 110 is provided as an individual laser chip fabricated separately and flip-mounted on the silicon photonics substrate 100. Optionally, each light signal outputted from the respective one laser chip is aligned to a silicon waveguide built in the silicon photonics substrate 100. Each light signal, through the silicon waveguide, is firstly coupled into a power splitter 120 and is split into two light signals in two separate branches with a split ratio varying from 5:95 to 50:50. Optionally, one split light signal from a minor split branch of the power splitter 120 is used for monitoring or wavelength locking or feedback control. Optionally, one light signal from one major split branch of the power splitter 120 is fed to one of four modulators 160. Optionally, the power splitter is a 50:50 splitter, the light signal is converted to two replicate light signals, basically doubling the channel numbers. Each replicate light signal is fed into a modulator. Totally, the optical-electrical transceiver 1000 of FIG. 2 shows four modulators 160 respectively for receiving light signals from four first branches (01) while four other modulators for the four second (replicate) branches (02) are not explicitly shown. Of course, there can be many variations in functional setups or optical layouts to handle these light signals and configure in different manners for different applications of the optical-electrical sub-module other than the one optical-electrical transceiver including 4 CWDM channels plus 4 replicate CWDM channels. For example, optionally, the optical-electrical transceiver 1000 is provided with a set (>4) of lasers with a smaller channel spacing than the CWDM channels to provide >4 wavelengths. The whole system will then have to operate in the same multi-wavelength plan.

Optionally, the modulator 160 in any one of first branch 01 is configured in a linear waveguide-based Mach-Zehnder modulation scheme. Each modulator 160 includes two waveguide branches with desired phase delay configured to match with respective one of four wavelengths 1270 nm, 1290 nm, 1310 nm, and 1330 nm of the four CWDM channels. Optionally, the four wavelengths can be selected from a group of 1270 nm, 1280 nm, 1290 nm, and 1300 nm or a group of 1300 nm, 1310 nm, 1320 nm, and 1330 nm with smaller channel spacing. Optionally, each wavelength is selected from a range from 1270 nm to 1330 nm as one CWDM channel to support the optical signal transmission in high-speed (e.g., 100 Gbit/s or higher) data communication. A Driver module 150 is provided as a separately fabricated CMOS or SiGe chip flip-mounted on the same silicon photonics substrate 100. Optionally, a redundant or a replicate driver module 150' (not shown in FIG. 2) is also provided as a chip flip-mounted on the same silicon photonics substrate 100 for driving the other four modulators in the replicate split branch (not shown). The driver module 150 is configured to drive all the four modulators 160 to modulate the light signals in the four CWDM channels. Optionally, one 8-channel driver is able to drive the 4 channels plus 4 replicate channels. Optionally, the driver module 150 employs PAM-N(N is an integer) modulation protocol or NRZ modulation protocol to modulate the light signal. For example, the modulators 160 are provided as silicon-waveguide-based Mach-Zehnder interferometer configured to provide PAM4 modulation though other formats can be employed. After modulation, the four CWDM channels of light signals are guided to the 4-to-1 multiplexer (Mux) 210 in the PLC block 200 which outputs a multiplexed light signal through an optical fiber (not shown) to an output port 211 of the sub-module 1000. Optionally, there is another 4-to-1 Mux (yet not shown) formed in the PLC block 200 for combining the other 4 replicate CWDM channels of light signals to one multiplexed light signal which is through another fiber (not shown) led to the output port 211. Effectively, a combination of the 4 laser chips 110 and 4 or 8 modulators 160 driven by the driver module 150 or plus a replicate driver module 150' forms an integrated 4-ch optical transmit path plus another 4-ch replicate optical transmit path (not shown in FIG. 2).

Referring to FIG. 2 again, the optical-electrical transceiver sub-module 1000 includes a 4-ch optical receive path. In the optical receive path, the optical de-multiplexer (Demux) 220 in the PLC block 200 receives an incoming light signal via an input port 221 from an external network which is configured to operate under the four CWDM channel wavelengths for transmitting corresponding data signals. The incoming light signal carrying four multiplexed wavelengths is demultiplexed into 4 separate light signals in the respective 4 wavelengths guided into respective four waveguides formed in the silicon photonics substrate 100. The High-speed photodetectors 130 are used to detect these four light signals separately and converted to respective electrical current signals. In the embodiment, the 4-channel optical receive path of the optical-electrical transceiver sub-module 1000 also includes a trans-impedance amplifier (TIA) module 140 for independently processing the electrical current signals converted from respective four separate light signals for communicating with host electrical network system via an electrical host interface. Optionally, the TIA module 140 is separately formed and flip-mounted on the same silicon photonics substrate 100. Optionally, the optical-electrical transceiver sub-module 1000 also includes a replicate 4-ch optical receive path as the four replicate channel light signals can be demultiplexed from another incoming light by another demultiplexer. In the replicate 4-ch optical receive path, a replicate TIA module 140' (not shown) can be included for independently processing four more electrical signals converted from respective four replicate light signals for communicating with host electrical network system with 2× expanded bandwidth. Optionally, the TIA module 140' is also a flip chip mounted on the same silicon photonics substrate.

In another aspect, the present disclosure provides a fabrication process for the integrated optical-electrical sub-module based on silicon photonics platform such as the transceiver sub-module 1000. In some embodiments, the fabrication process includes wafer level assembly of 2.5 D silicon photonics substrate involving 2.5 D silicon interposer and 220 nm silicon-on-insulator (SOI) substrate. The process includes monolithic formation of multiple silicon or silicon nitride waveguides in the silicon photonics substrate 100 for connecting or aligning with several different silicon photonics devices including power splitters, SiGe or Ge high-speed photodetectors, and Si/SiN-based Mach-Zehnder interferometer modulator devices formed in the same silicon photonics substrate 100. The process also includes coupling the silicon waveguides with passive PLC devices such as optical multiplexers and demultiplexers formed on a glass or sapphire substrate and mounted onto the silicon photonics substrate as PLC block 200. The process further includes flip-mounting active devices such as laser chips to the silicon photonics substrate as an in-packaged design and align the laser chips directly to the waveguides in the silicon photonics substrate or PLC devices in the PLC block. Optionally, some of the silicon photonics components mentioned above are also silicon waveguides themselves monolithically formed in a same manufacture process for preparing the silicon photonics substrate to integrate the optical-electrical transceiver sub-module 1000.

Figure 3:
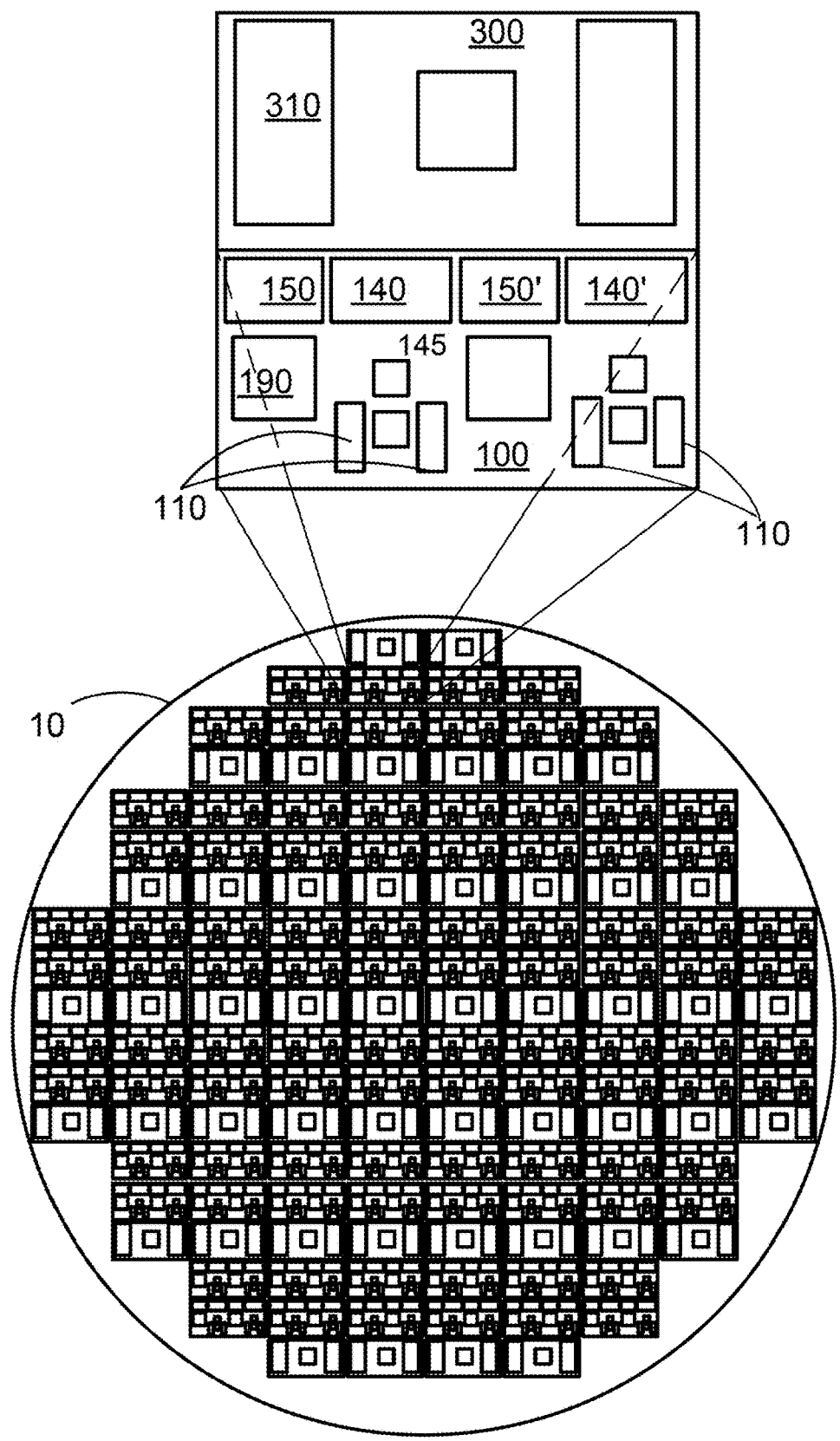
FIG. 3 is a schematic top view of wafer level assembly of a plurality of in-packaged silicon photonics chips on a single substrate according to an embodiment of the present invention.

FIG. 3 shows a schematic top view of a wafer level assembly of a plurality of in-packaged silicon photonics chips on a single substrate according to an embodiment of the present invention. This diagram is merely an example, which should not unduly limit the scope of the claims. One of ordinary skill in the art would recognize many variations, alternatives, and modifications. As shown, using the integrated optical-electrical transceiver sub-module as an example, the silicon photonics substrate 100 is one die fabricated from a CMOS compatible process plus a post CMOS wafer level assembly out of a SOI wafer 10. In an example, each die 100 is used to form an optical-electrical module by directly processing the SOI wafer to form a silicon photonics through-substrate via (TSV) interposer. More details of the fabrication process involving the TSV interposer can be found in U.S. patent application Ser. No. 15/887,758 filed Feb. 2, 2018 and commonly assigned to Inphi Corp. Santa Clara, Calif. The as-mentioned application is incorporated by reference herein for all purposes. Utilizing the silicon photonics TSV interposer several optical or electrical components for forming the optical-electrical module can be directly mounted on. Referring to FIG. 3, the one die 100 in the wafer 10 is enlarged out, showing that several electrical and optical components including two driver chips 150, 150', two TIA chips 140, 140', two dummy chips 190, and four field effect transistors 145 (to apply bias to the laser chips 110) is flip-mounted on the top side of the die in a post CMOS wafer level assembly. Especially, four laser chips 110 are also directly flip-mounted to respective chip sites on the die and optically aligned with waveguides formed therein as an in-packaged assembly without any wire bonding.

Additionally referring to FIG. 3, multiple redundant dies are arranged in multiple pairs of rows on the wafer substrate 10. Each die 100 includes four CWDM laser chips 110. The wafer substrate 10 also is configured to lay out multiple rows of blink probing pads 300 designed for conducting wafer level burn-in and testing conveniently. Each probing pad 300 includes electrodes 310 for easily coupling with external tester electrodes to allow proper bias current being applied in series to a plurality of laser chips on the wafer substrate 10. More details on designing a chip site on the die for mounting a laser chip and performing wafer level burn-in and testing for the laser chip can be found in U.S. patent application Ser. No. 16/800,974, filed Feb. 25, 2020, which is commonly assigned to Inphi Corp. Santa Clara, Calif. and incorporated by reference herein for all purposes.

Figure 4:
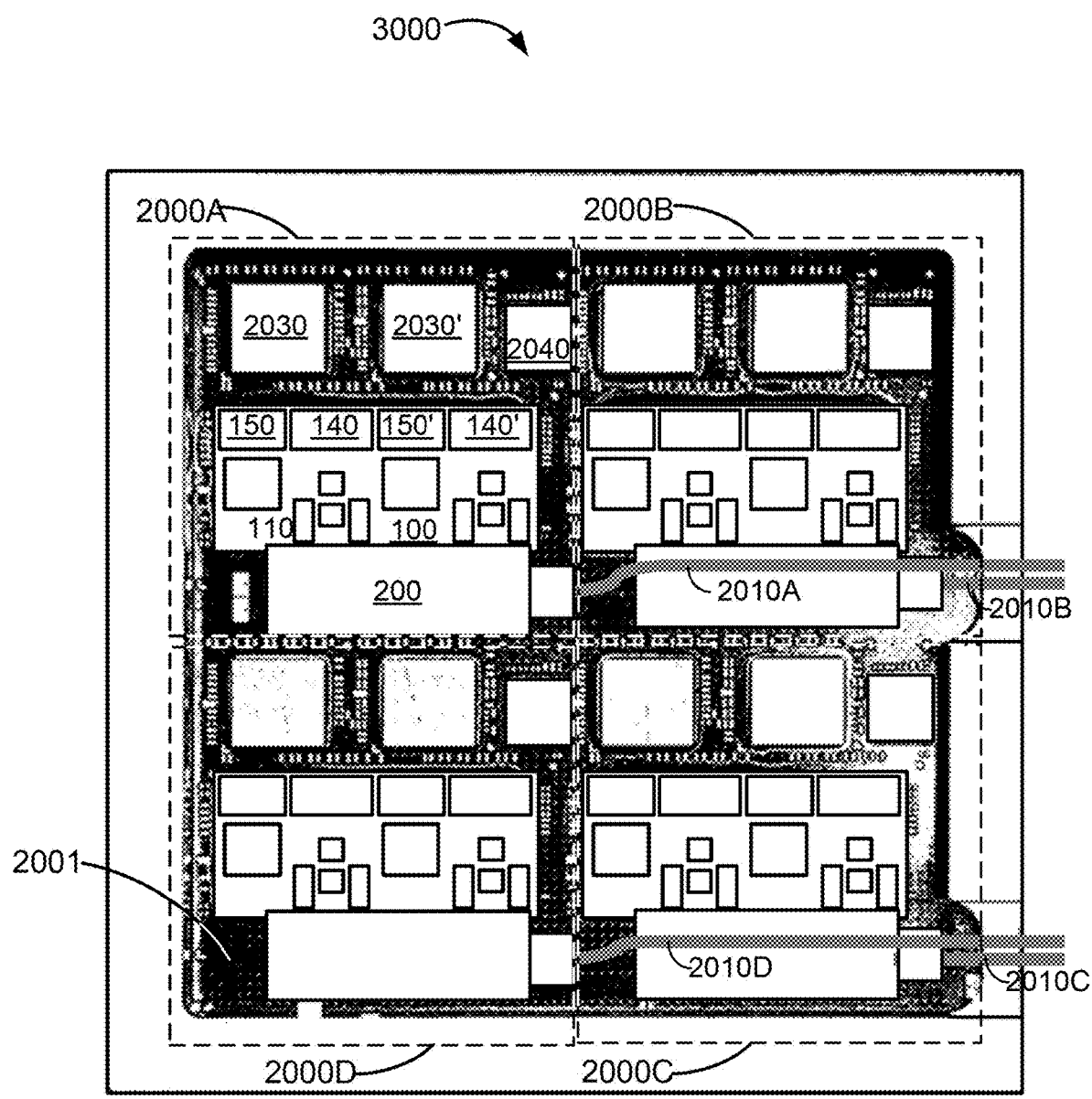
FIG. 4 is a schematic top view of an in-packaged optical-electrical module of four sub-module light engines according to an embodiment of the present invention.

In yet another aspect, the present disclosure provides an in-packaged optical-electrical module assembling four optical-electrical sub-modules as mentioned above. FIG. 4 shows a schematic top view of an in-packaged optical-electrical module of four sub-module light engines according to an embodiment of the present invention. This diagram is merely an example, which should not unduly limit the scope of the claims. One of ordinary skill in the art would recognize many variations, alternatives, and modifications. In an embodiment shown in FIG. 4, the in-packaged optical-electrical module 3000 is provided by integrating four sub-modules 2000A, 2000B, 2000C, and 2000D evenly packaged in four compact areas on a common component substrate 2001. Optionally, each sub-module is formed on its own component substrate which is named as a sub-module substrate.

Each of the four sub-modules in FIG. 4 is substantially redundant and independently functioned as a 4-wavelength transceiver driven by 4 in-packaged lasers to provide 4 light signals for 4 CWDM channels plus 4 replicate CWDM channels as shown in a block diagram of FIG. 2. Optionally, the in-packaged optical-electrical module can integrate two sub-modules. Optionally, the in-packaged optical-electrical module can integrate 6 sub-modules or more. Referring to FIG. 4, in an example, each 4-wavelength transceiver includes a silicon-photonics (SiPho) chip 100 diced from one die from the wafer substrate 10 of FIG. 3. The four CWDM channels are provided by four light signals at respective four CWDM channel wavelengths centered at, 1270 nm, 1290 nm, 1310 nm, and 1330 nm from respective 4 laser chips 110 that are directly flip-mounted on the SiPho chip 100 with its p-side facing toward the SiPho chip. The laser light emitted from each laser chip 110 is aligned to a Si-based waveguide formed in the SiPho chip 100. Optionally, the Si-based waveguide includes an optical splitter to split the laser light to two branches to provide 4 CWDM channels and 4 replicate CWDM channels. Correspondingly, on each SiPho Chip 100, one driver chip 150 and one TIA chip 140 are included for handling transmission and detection of light signals involving the 4 CWDM channels and one replicate driver chip 150' and one replicate TIA chip 140' are included for handling transmission and detection of light signals associated with the 4 replicate CWDM channels. The SiPho chip 100 is coupled to a planar light circuit (PLC) block 200, both being bonded to a top side of the corresponding sub-module substrate 2001.

Optionally, each of the four sub-modules in FIG. 4, e.g., 2000A in upper left portion, also includes a digital signal processing (DSP) chip 2030 plus an replicate one DSP chip 2030' and a microcontroller chip 2040, all mounted on the same top side of the sub-module substrate 2001 as the SiPho chip 100 and PLC block 200. Both the driver chip 150 and the driver chip 150' are interfaced via an electrical host interface with external electrical host system respectively through the digital signal processing (DSP) chips 2030 (and 2030') to handle the electrical data input from an electrical host. The DSP chips also are configured to interact via a host control interface with the microcontroller chip 2040 to provide module control and power supply required for operating the SiPho chip 100. Optionally, the DSP chips 2030 and 2030' include a gear box or retimer chip for converting analog signals to digital signals through N to N lanes electrical data transfer, a digital processor for processing the digital signals, one or more interface devices for communicating with external electrical host, and current drivers for driving the four laser chips. Optionally, the microcontroller chip 2040 is associated with a respective one sub-module 2000A and is configured to control operations of the DSP chips 2030, drivers 150, TIA 140, and interfaces therein. Optionally, the modulators in the SiPho chip 100 are configured to modulate the laser light signals based on PAM-N protocol, for example, PAM-4 protocol, or based on NRZ protocol. Optionally, the modulators are configured in a Mach-Zehnder Interferometer formed with Si-based waveguides in the silicon photonics substrate.

The PLC block 200 associated with each of the four sub-modules 2000A (through 2000D) includes at least a first optical multiplexer (see FIG. 2) in an optical transmit path to multiplex the four light signals of the four CWDM channels into one output light in one optical fiber and a second optical multiplexer in a replicate optical transmit path to multiplex the four replicated light signals into another output light in another optical fiber. Each optical multiplexer in the PLC block 200 is a planar waveguide formed on a glass or sapphire substrate and properly coupled to one optical fiber. Both optical fibers can be packaged into one on-board fiber cable 2010A (through 2010D) coupled between the PLC block 200. For each sub-module, e.g., 2000A, one optical transceiver transmits eight total output light signals carrying 4 CWDM channels plus 4 replicate CWDM channels to external optical network. In the embodiment, the compact in-packaged optical-electrical module 3000 totally includes four sub-modules 2000A through 2000D, delivering total 32 CWDM channel signals to the external optical network.

In the embodiment, the PLC block 200 associated with the same one of the four sub-modules, e.g., 2000A (through 2000D), also includes a built-in optical receive path configured to receive incoming light signals via optical fibers from network. The PLC block 200 includes at least a first optical demultiplexer to demultiplex an incoming light signal from one fiber (carrying 4 wavelengths) to four individual light signals with the respective four CWDM channel wavelengths. Each optical demultiplexer in the PLC block 200 is a planar waveguide formed on a glass or sapphire substrate properly coupled to one optical fiber. Each of the four individual light signals is coupled from planar waveguide in the PLC block 200 to the waveguides in the silicon photonics substrate and delivered to a photodetector block (referred to FIG. 2). The photodetector block (130 as shown in FIG. 2) individually detects and converts each light signal to an electrical current signal passed to and processed by a transimpedance amplifier (TIA) module 140 to generate a voltage signal. The voltage signal is further handled or digitized and processed by on-board DSP chip 2030 and fed to an external electrical host receiver. The incoming light signal as mentioned above can be received via an optical fiber that also is packaged into the on-board fiber cable 2010A. Optionally, a second optical demultiplexer is included in the PLC block 200 for receiving and demultiplexing another incoming light signal carrying 4 replicate CWDM channel wavelengths into a replicate receive optical path to provide additional bandwidth with 4 replicate CWDM channels which can be separately detected by photodetectors and converted to corresponding electrical signals. The electrical signals can be processed by a replicated TIA module 140' and digitally processed by DSP chip 2030' in the same sub-module.

In this embodiment, PLC block 200 contains two 4-to-1 multiplexer and two 1-to-4 demultiplexer to create two sets of four light paths. For the multi-channel light engine 3000 that packages total four optical-electrical sub-modules 2000A, 2000B, 2000C, 2000D, it can detect different input light signals in 32 channels. In a case that each channel carries data in a rate of 50 Gbit/s, each quadrant sub-module delivers 400 Gbit/s in data rate with 4 CWDM lasers. The in-packaged optical-electrical module 3000 can provide 1.6 Tbit/s data switching communication capacity. In another case with improved modulators, driver chip, TIA chip, and DSP chip, each channel can carry 100 Gbit/s speed even though each quadrant sub-module uses the same 4 CWDM lasers. As a result, the in-packaged optical-electrical module 3000 can expand its data switching communication speed up to 3.2 Tbit/s.

Figure 5:
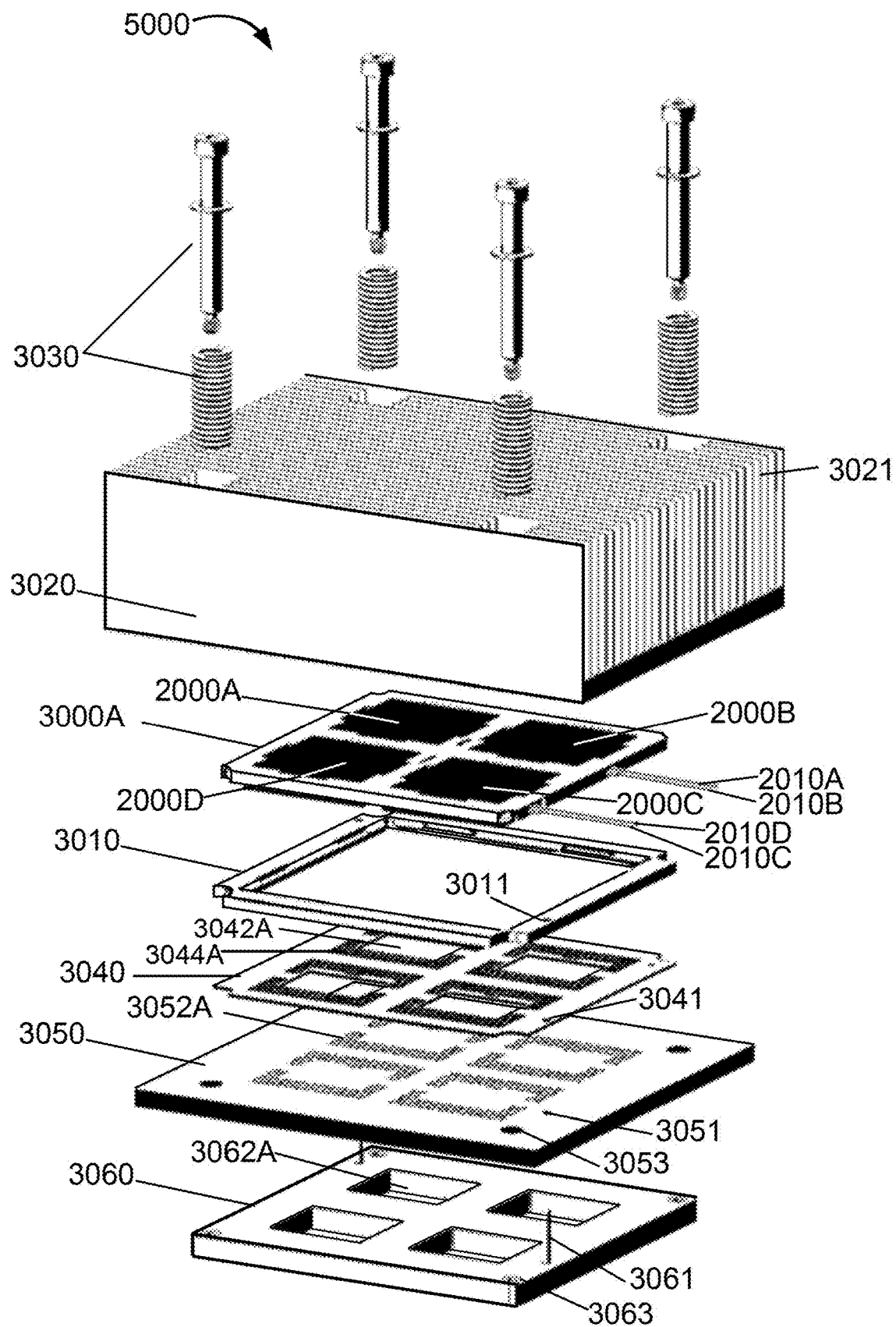
FIG. 5 is an exploded view of a package for the optical-electrical module of FIG. 4 integrated with a heatsink and interfaced to a line card printed circuit board according to an embodiment of the present invention.
Figure 6:
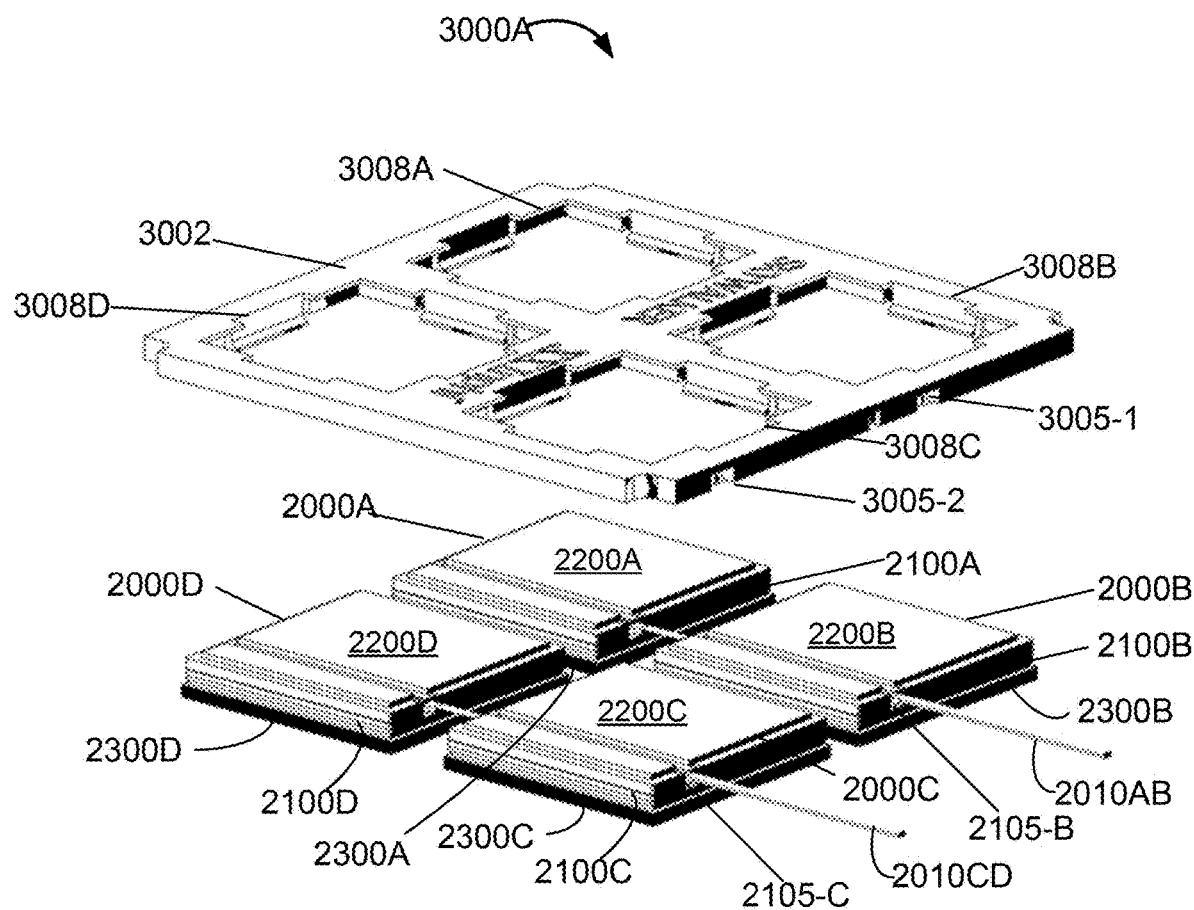
FIG. 6 is an exploded view of a sub-assembly of four sub-module light engines in the package of FIG. 5 according to an embodiment of the present invention.
Figure 7:
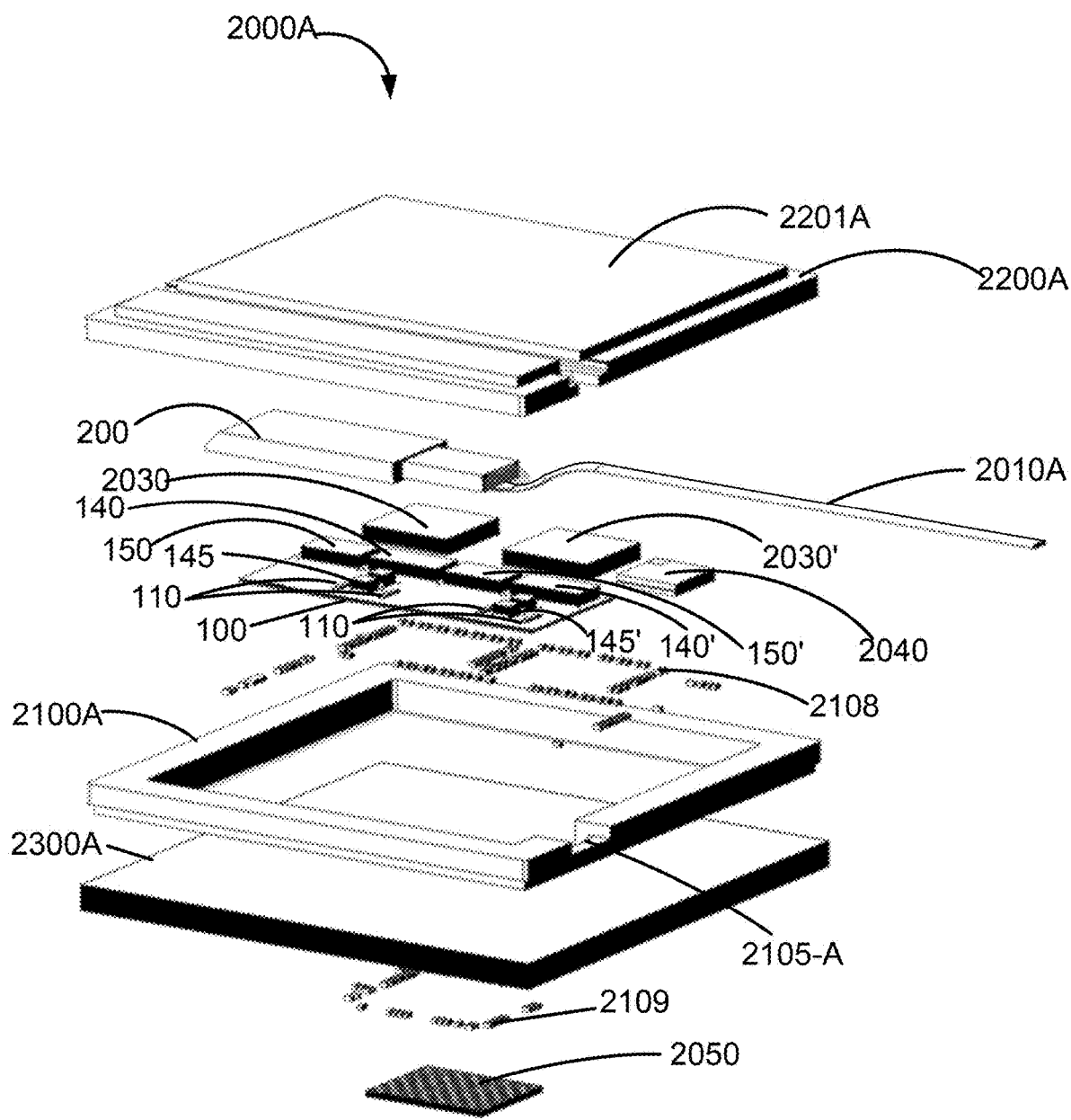
FIG. 7 is an exploded view of a sub-assembly of one sub-module light engine in the sub-assembly of FIG. 6 according to an embodiment of the present invention.

In still another aspect, the present disclosure provides a packaging assembly of the in-packaged optical-electrical module of FIG. 4 as mentioned above. The packaging assembly are illustrated with several exploded views in FIGS. 5, 6, and 7 in different levels of revelation of the packaging structures and mounting fixtures for sub-modules and components therein. FIG. 5 is an exploded view of a packaging assembly 5000 of the in-packaged optical-electrical module of FIG. 4 integrated with a heatsink and interfaced to a module line card based on a printed circuit board according to an embodiment of the present invention. FIG. 6 shows a sub-assembly 3000A for packing four sub-modules within the packaging assembly of the four sub-modules in FIG. 5 according to an embodiment of the present invention. FIG. 7 shows a detailed sub-assembly 2000A of all components in one sub-module in FIG. 5 and FIG. 6 according to an embodiment of the present invention. These diagrams are merely examples, which should not unduly limit the scope of the claims. One of ordinary skill in the art would recognize many variations, alternatives, and modifications.

As shown in FIG. 5, the packaging assembly 5000 is provided by compressing a sub-assembly 3000A of the multi-channel light engine 3000 of FIG. 4 between a top plate member 3020 on top and a backplate member 3060 at bottom. The sub-assembly 3000A of the in-packaged optical-electrical module 3000, as shown in FIG. 6, includes a single piece of solid frame fixture member 3002 having two crossly-linked middle bars to form four closely packed window structures, 3008A, 3008B, 3008C, and 3008D. The four window structures are designed to allow respective four sub-assemblies, i.e., 2000A, 2000B, 2000C, and 2000D to fit in. Each sub-assembly (e.g., 2000A) is designed to have the corresponding sub-module packaged within a case enclosed by a lid member 2200A on top sealed with a peripheral side member 2100A around a peripheral region of a sub-module substrate 2300A at bottom. FIG. 7 shows package structures and component layouts within each sub-assembly of a sub-module (e.g., 2000A). More details will be described in following paragraphs.

Referring to FIG. 6, the solid fixture member 3002 includes notches 3005-1 and 3005-2 at least partially opened downward at one middle bar and one side of the frame fixture member 3002. The lid member (e.g., 2200B) of each sub-assembly (e.g., 2000B) includes an open slot 2105-B facing upward through a length of one side of the peripheral side member 2100B to align with the notch 3005-1. The open slot 2105-B provides an open space for laying a pair of fiber cables 2010AB which respectively packages optical fibers out of the optical-electrical sub-module in the sub-assembly 2000A and 2000B. Similarly, another pair of fiber cables 2010CD also packages optical fibers out of the sub-assembly 2000D and sub-assembly 2000C and is laid in the open space provided by the open slot 2105-C aligned with the notch 3005-2.

Referring to FIG. 5 and FIG. 6, as the sub-assembly 3000A is assembled in the packaging assembly 5000, top surfaces of the lid members (e.g., 2200A) of four sub-assemblies (e.g., 2000A) are mechanically pressed in a good thermal contact against a bottom surface of the top plate member 3020 in the packaging assembly 5000. In an embodiment, as shown in FIG. 5, a top side of the top plate member 3020 is configured with a heatsink having a plurality of fin structures 3021 extended vertically. The height of the plurality of fin structures are designed to help release module heat with a sufficiently high efficiency. Optionally, a thermal pad (not shown) can be inserted between the top surface of the lid members and the bottom surface of the top plate member 3020 to enhance the thermal conductivity. The heatsink is configured to release the heat generated by the four sub-modules in the sub-assembly 3000A in which each sub-module contains 4 CWDM lasers and multiple pre-packaged CMOS chips like the driver chip 150 and TIA chip 140 and DSP chip 2030. Mechanically, the top plate member 3020 is pressed by several spring-loaded compression pins 3030 with threaded head applied from the top side to lock in respective sockets 3063 with the backplate member 3060 in the package assembly 5000.

Referring to FIG. 7, the sub-assembly of the sub-module 2000A includes a case having a top lid member 2200A covering a peripheral side member 2100A located around a peripheral boundary region on top of a sub-module substrate 2300A which is served as a bottom member for the sub-assembly 2000A. Optionally, the sub-assembly 2000A is a quadrant portion fitted in one of four window structures (e.g., 3008A) of the package sub-assembly 3000A. Optionally, the peripheral side member 2100A includes at least an open slot 2105-A for laying at least a fiber cable 2010A for optical input/output fibers of the optical-electrical sub-module in the sub-assembly. Optionally, a top surface 2201A of the lid member 2200A may be attached with a thermal pad (not shown) for enhancing heat release efficiency of the sub-assembly 2000A. Optionally, the sub-module substrate 2300A also is structured to allow heat being conducted effectively through itself.

In one embodiment, as illustrated in FIG. 7, the sub-module packaged in the sub-assembly 2000A includes a SiPho chip packaged on a silicon-photonics substrate 100 which is mounted on a top side of the sub-module substrate 2300A. The SiPho chip 100 is substantially the same as one die formed on a SOI wafer 10 using wafer level assembly process as shown in FIG. 3. Referring to FIG. 7, the SiPho chip 100 includes a driver chip 150 and a replicate driver chip 150', a TIA chip 140 and a replicate TIA chip 140', and four laser chips 110, all flip-mounted on top of the same silicon-photonics substrate 100. Some dummy chips (not shown) and field-effect transistor devices 145 can also mounted on top of the same silicon-photonics substrate 100. The SiPho chip includes a transmitter unit configured to generate multi-channel optical signals from the four laser chips which are modulated by four modulator devices driven by the driver chip based on data received via an electrical interface block. The multi-channel optical signals are transmitted to an optical transmit path coupled to an optical interface block to output a multiplexed optical signal.

In the embodiment, the same SiPho chip also includes a receiver unit configured to use a set of photodetectors to detect multi-channel optical signals received in an optical receive path and demultiplexed in the optical interface block from an incoming multiplexed optical signal and use the TIA chip to convert the detected multi-channel optical signals to current signals which are digitized and processed in the electrical interface block before being delivered as N to N lanes of digitized signals for electrical host. including an optical transmit path and an optical receive path in the same silicon photonics substrate 100. One driver chip 150 and one TIA chip 140 in the SiPho chip are involved in handling transmission of four light signals from the four laser chips to the optical transmit path and detecting four incoming light signals from the optical receive path. Another driver chip 150' and another TIA chip 140' are separately involved in handling transmission of four replicate light signals from the four laser chips to the optical transmit path and detecting four additional incoming light signals from the optical receive path. These TIA/Driver chips in each SiPho chip of the packaged sub-assembly 2000A are configured to handle reception and transmission of light signals in two replicate sets of 4 CWDM channels with respective wavelengths centered at 1270 nm, 1290 nm, 1310 nm, and 1330 nm. Optionally, the electrical interface block comprises a digital signal processing (DSP) chip 2030 configured to process N to N Lanes of digitized signals with a data rate of 25 Gbit/s per lane. Optionally, the electrical interface block comprises a digital signal processing (DSP) chip 2030 configured to process N to N Lanes of digitized signals with a data rate of 50 Gbit/s per lane. Optionally, the electrical interface block comprises a digital signal processing (DSP) chip 2030 configured to process N to N Lanes of digitized signals with a data rate of 50 Gbit/s per lane. Optionally, the electrical interface block comprises a replicate digital signal processing (DSP) chip 2030' and a microcontroller chip 2040.

Additionally referring to FIG. 7, disposed along one side of the SiPho chip on the silicon photonics substrate 100, a PLC block 200 is also mounted on the sub-module substrate 2300A. The PLC block 200 includes one or more multiplexers and demultiplexers in PLC-based waveguide formed on a glass or sapphire substrate for guiding light waves to an optical output port and from an optical input port of the sub-assembly 2000A by coupling light signals between the PLC block 200 and input/output optical fibers. The input/output optical fibers per one sub-assembly are packaged in one fiber cable 12010A.

Furthermore referring to FIG. 7, disposed along another side of the SiPho chip on the silicon photonics substrate 100, one or more ASIC chips, for example, digital signal processing (DSP) chip(s) 2030(2030'), can be flip-mounted on the same sub-module substrate 2300A. Each DSP chip 2030 or 2030' is configured in an electrical interface block to support functions of one TIA chip 140 and one driver chip 150 for processing or modulating optical/electrical signals involving a 4-ch CWDM optical transmit/receive path or one replicate TIA chip 140' and one replicate driver chip 150' for processing or modulating optical/electrical signals involving a replicate 4-ch CWDM transmit/receive path. Moreover, a microcontroller chip 2040 is also flip-mounted to the sub-module substrate 2300A next to the replicate DSP chip 2030' and configured in the electrical interface block to support operation of the DSP chip or replicate DSP chip as well as the operation of SiPho chip. Referring to FIG. 7, the DSP chips 2030 (2030'), or microcontroller chip 2040 are mounted onto a front side of the sub-module substrate 2300A via multiple conductive bonding bumps 2108. Optionally, the sub-module substrate 2300A also provides its bottom side for mounting additional functional chips for utilizing the substrate more efficiently to enhance performance of the light engine. For example, an ASIC chip 2050 for analog controls for the laser and modulator is mounted at the bottom side of the sub-module substrate 2300A via multiple bumps 2109 based on through-substrate vias.

Referring to FIG. 5 and FIG. 6, the sub-assembly 3000A of the in-packaged light engine 3000 is received by or disposed in a socket frame member 3010 from its top side. An interposer plate 3040 is configured to be disposed between bottom side of the four sub-module substrates (e.g., 2300A) of the sub-assembly 3000A and a top side of a module substrate 3050. Optionally, the four sub-module substrates 2300A through 2300D (see FIG. 6) may be considered as one common substrate. Optionally, the module substrate 3050 is configured to serve as a line card including relevant electrical connection circuits in a printed circuit board (PCB) to the host. Optionally, the module substrate 3050 is a part of a larger line card by itself. The PCB associated with the module substrate 3050 is configured with integrated circuits with a line interface connecting via the four sets of conducting bump contacts to the four sub-assemblies of the optical-electrical sub-modules and configured as a line card with a host interface for connecting the multi-channel light engine to a data center and with an external power interface for accessing external power supply. Optionally, the interposer plate 3040 includes four groups of patterned through-substrate-vias (TSVs) (e.g., 3044A) designed for coupling the bottom sides of four sub-module substrates 2300A through 2300D respectively for the four optical-electrical sub-modules 2000A through 2000D.

Optionally, the interposer plate 3040 is a passive interposer provided with four quadrant grids of conductor-filled through-substrate via (TSVs) bumps respectively formed on four quadrant regions of the interposer plate projected to the four sub-module substrates. For example, the quadrant grid of TSV bumps 3044A is designed for forming electrical connections between the sub-module substrate 2300A to direct bonding interconnects (DBI) contacts 3052A in a corresponding quadrant region of the module substrate 3050. Optionally, each quadrant grid of TSV bumps (e.g., 3044A) is provided to surround a quadrant hollow region (e.g., 3042A) of the interposer plate 3040 to yield the space for optional ASIC chip (e.g., 2050 in FIG. 7) mounted on the back side of the sub-module substrate (e.g., 2300A).

Optionally, the interposer plate 3040 is an active interposer that contains four quadrant grids of TSV bumps to connect IOs and supply as well as to provide active regions with embedded circuit devices to pass electrical signals using buffers between two DBI contacts. Optionally, the interposer plate 3040 is a 2.5 D silicon interposer. Optionally, the interposer plate 3040 is a 3 D silicon interposer.

Referring to FIG. 5, the module substrate 3050 includes several alignment through-holes 3051 aligned with similar alignment through-holes 3041 in the interposer plate 3040 and that 3011 in the socket frame member 3010. The backplate member 3060 includes an alignment pin 3061 configured to pass through those alignment through-holes 3051, 3041, and 3011 for properly stacking these assembly members together. The module substrate 3050 also has several through-holes 3053 allowing the compression pins 3030 to pass for locking all parts in the package assembly 5000 with the backplate member 3060. The backplate member 3060 includes several opened window regions (e.g, 3062A) designed to provide space for mounting additional chips on the backside of the module substrate 3050. Optionally, these window regions provide better thermal conductivity for the package assembly 5000. The backplate member 3060 has several threaded holes 3063 allowing the corresponding compression pins 3030 with threaded head to lock in there so that the package assembly 5000 is tightly assembled.

In still another aspect, the present invention provides a light engine chiplet that integrates a silicon photonics (SiPho) chip with opto-electrical interfaces to form a multi-channel transceiver in a compact package on a single substrate. Optionally, the light engine chiplet is provided as one integrated optical-electrical module outlined in FIG. 1 to receive data in 25 G or 50 G or 100 G for driving 4-wavelength lasers to achieve N electrical to N optical lanes communication. Optionally, the light engine chiplet is configured as an optical-electrical transceiver integrating 4 lasers with a driver module and a TIA module on a silicon photonics substrate to provide 4 CWDM channels plus 4 replicate channels coupled to a PLC block as shown in FIG. 2. Optionally, the light engine chiplet is provided as a quadrant sub-module on a same module substrate of an in-packaged optical-electrical module 3000 in FIG. 4. Alternatively, the in-packaged optical-electrical module can assemble two light engine chiplets or six light engine chiplets depending on different capacities, reach ranges, and bandwidth requirements for different high-speed data communication applications.

Figure 8:
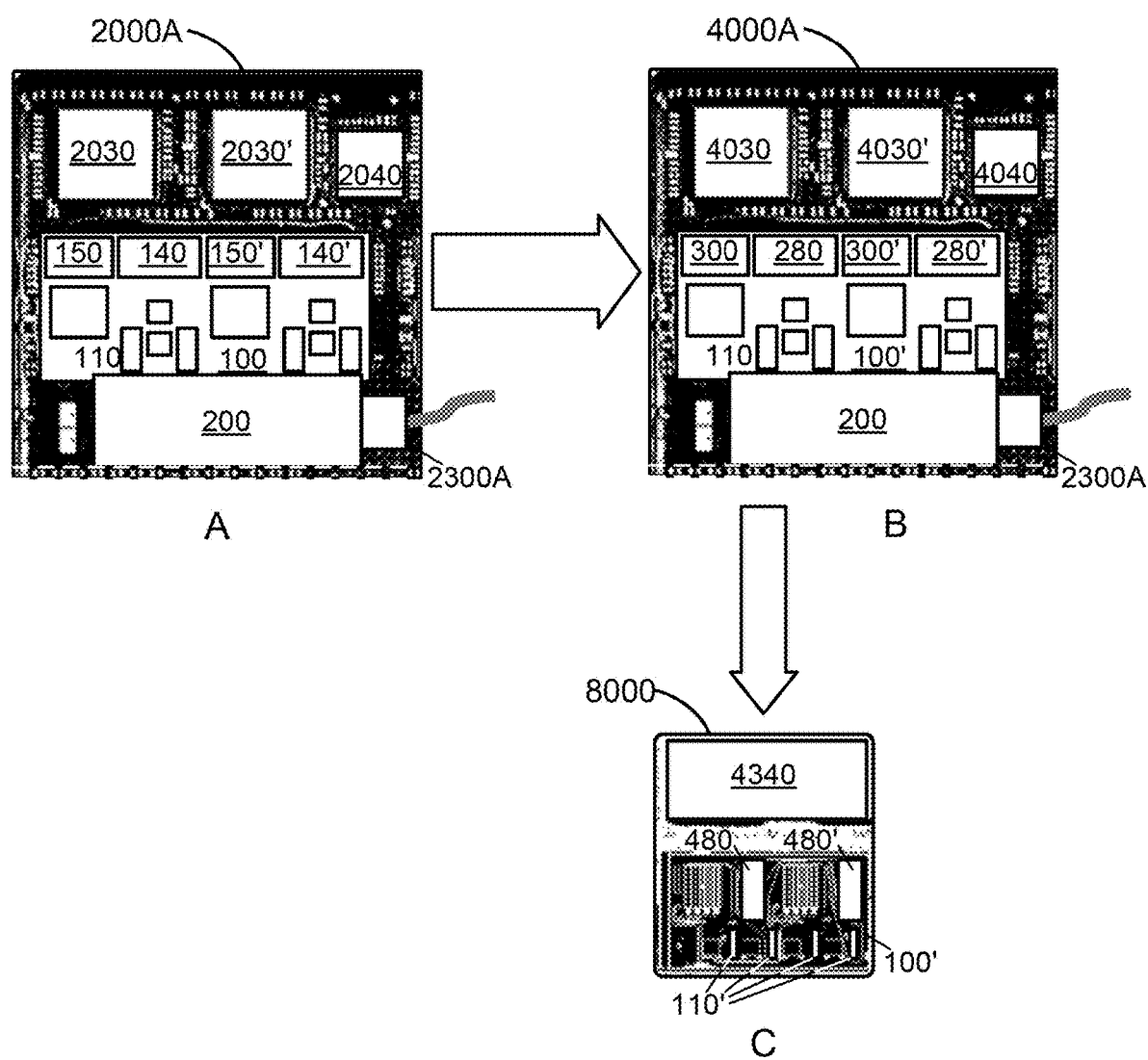
FIG. 8 shows an evolution of a light engine chiplet with improved chip data capacity and reduced lateral dimension according to an embodiment of the present invention.

FIG. 8 shows an evolution of a light engine chiplet with improved chip data capacity and reduced lateral dimension according to an embodiment of the present invention. This diagram is merely an example, which should not unduly limit the scope of the claims. One of ordinary skill in the art would recognize many variations, alternatives, and modifications. Referring to part A of the FIG. 8, the light engine chiplet is substantially the same as an optical-electrical sub-module 2000A disposed as a quadrant of the in-packaged optical-electrical module 3000 shown in FIG. 4. As described in FIG. 4, the light engine chiplet 2000A includes a SiPho chip 100 which integrates four laser chips 110 with a driver chip 150 and a TIA chip 140 as well as a replicate driver chip 150' and a replicate TIA chip 140' all mounted on a silicon photonics substrate and together functioned as a multi-channel optical-electrical transceiver. The SiPho chip 100 is mounted on a sub-module substrate shared with a DSP chip 2030 and a microcontroller chip 2040 as well as a replicate DSP chip 2030' and a PLC block 200. In the silicon photonics substrate, several waveguide-based 1-to-2 optical splitters are built in to split each laser light from a respective one of the four laser chips 110 into two branches, providing 4 replicate channels for respective 4 CWDM channels with center wavelengths at 1270 nm, 1290 nm, 1310 nm, and 1330 nm, respectively. Depending on the DSP chips and microcontroller chip and associated electrical host data input and host interface setting, a data rate per channel can be provided with 25 G using NRZ modulation protocol to modulate each of the four lasers 110, yielding 25 G×8=0.2 Tbit/s per light engine. If a data rate per channel is given by 50 G using PAM-4 modulation protocol to modulate each laser, it gives 0.4 Tbit/s per light engine with 8 optical lanes. Optionally, the light engine chiplet 2000A can be provided as one independent unit assembled within a four-unit optical-electrical module 3000 as shown in FIG. 4.

Referring to part B of the FIG. 8, the light engine chiplet 4000A is still a multi-channel transceiver configured with a substantially same setting as the light engine chiplet 2000A in chip layout, chip size, laser driving, silicon photonics substrate and waveguide design, and sub-module substrate design. The improvement lies in upgradation of corresponding chips and laser modulation scheme therein. For example, DSP chip 4030, 4030', microcontroller chip 4040, driver chip 300, TIA chip 280, replicate driver chip 300' and replicate TIA chip 280', and host data rate loaded via electrical host interface are upgraded to 100 G per channel using PAM-4 modulation protocol with a rate of 56 Gbaud/k so that the data capacity per light engine chiplet is doubled to 0.8 Tbit/s. The PLC block 200 and laser chips 110 can be substantially no change versus those in the light engine chiplet 2000A. Optionally, the light engine chiplet 4000A can be a quadrant of four-sub-module assembly independently operated in an optical-electrical module. Optionally, the light engine chiplet 4000A can be provided as one independent unit assembled within a multi-unit optical-electrical module.

Referring to part C of the FIG. 8, in an embodiment, the light engine chiplet 8000 is reconfigured to reduce the package size substantially. An integrated CMOS chip 4340 and a newly designed SiPho chip are mounted on a smaller sub-module substrate in a reduced lateral dimension. Optionally, the light engine chiplet 8000 are provided in a lateral dimension of 10 mm×10 mm or less, substantially reduced from 25 mm×25 mm for the light engine chiplet 2000A or 4000A. In the embodiment, an integrated processing chip 4340 combines the DSP chip (e.g., 4030) with the microcontroller chip (e.g., 4040) to provide electrical host interface for the multi-channel transceiver. Additionally, the driver chip(s) are alternatively integrated into the CMOS circuit (not visible in the figure). The TIA chip(s) 480 (480') have reduced sizes and are mounted on the newly designed SiPho chip on silicon photonics substrate 100'.

Optionally, the SiPho chip of the light engine chiplet 8000 still integrates 4 laser chips 110' on the silicon photonics substrate 100'. But all laser chips are redesigned for emitting laser light with higher power. In the silicon photonics substrate 100', several waveguide-based 1-to-4 optical splitters can be formed to yield 4 replicate channels per one laser. Thus, each light engine chiplet 8000 can provides 16 channels or 4 sets of 4 CWDM channels to yield total 1.6 Tbit/s capacity if each channel is provided with 100 Gbit/s capacity under PAM-4 56 Gbaud data modulation. Optionally, the high-power laser chips could be mounted on the silicon photonics substrate 100', or mounted externally and coupled into the waveguide-based devices in the silicon photonics substrate 100'. Optionally, the SiPho chip of the light engine chiplet 8000 can integrate 8 laser chips when each laser chip is coupled to a 1-to-2 optical splitter. Optionally, the light engine chiplet 8000 still just integrate 4 laser chips 110' on the silicon photonics substrate 100' respectively coupled to four 1-to-2 optical splitters, giving 8 channels per chiplet. Optionally, a next generation modulation scheme using PAM-6 or PAM-8, or using higher Gbaud rate under PAM-4, a 200 Gbit/s per wavelength capacity can be provided so that each light engine chiplet in a 10 mm×10 mm package can still yield 1.6 Tbit/s capacity. Optionally, coherent polarized light signal can be implemented to provide directly 200 Gbit/s or 400 Gbit/s per wavelength in bandwidth to allow each chiplet to support extra-high data rate communication. Optionally, the light engine chiplet 8000 can be provided as one independent unit assembled within a multi-unit optical-electrical module or directly integrated on a same switch substrate with multiple chiplets and a switch processor.

Figure 9:
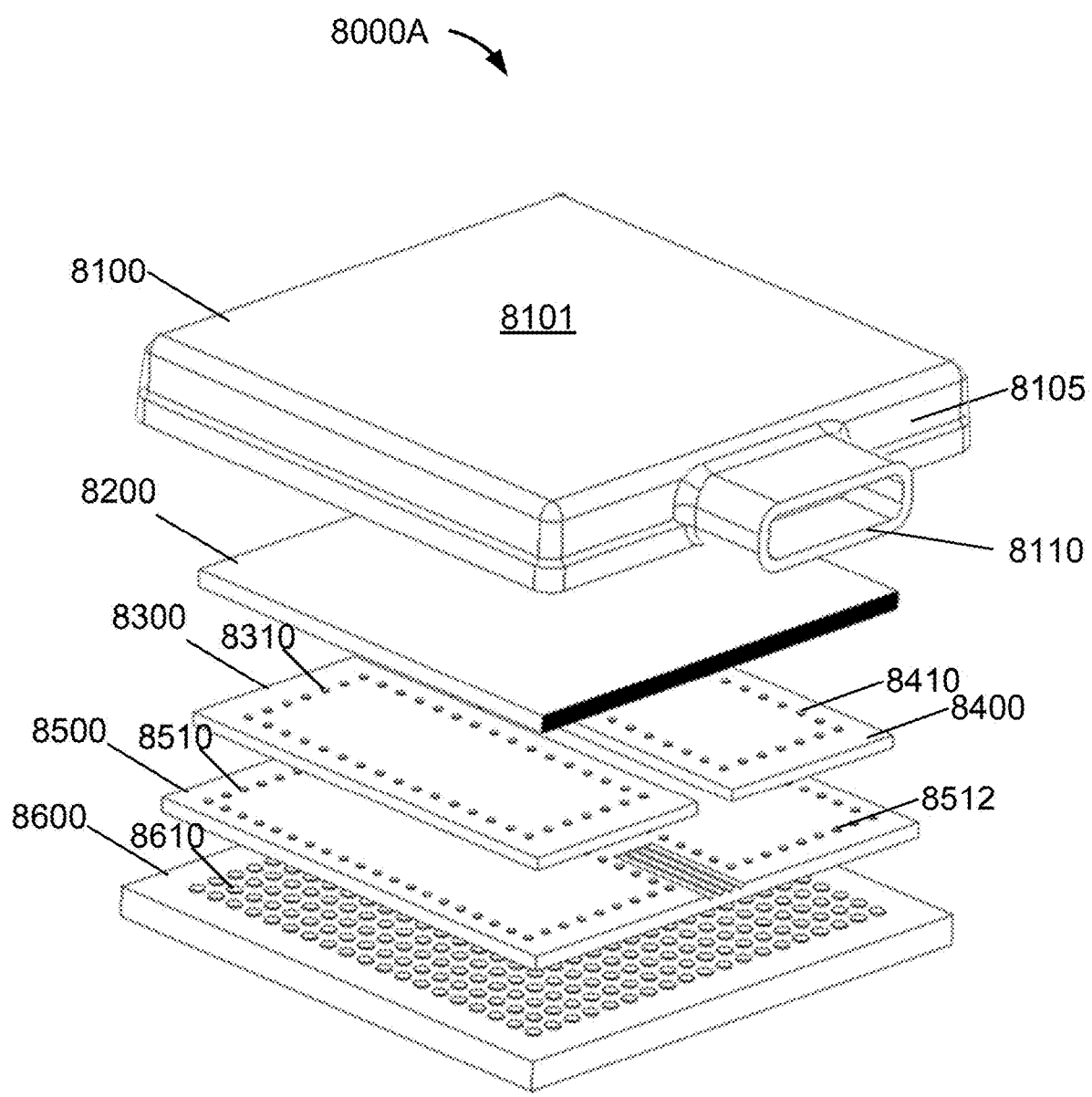
FIG. 9 is an exploded view of a sub-assembly of a light engine chiplet with reduced lateral dimension according to an embodiment of the present invention.

Referring to part C of FIG. 8, the smaller sub-module substrate of the light engine chiplet 8000 forces some changes in the packaging assembly of all optical-electrical components therein. For example, the lateral dimension of the chiplet 8000 can be reduced to 10 mm×10 mm or smaller. FIG. 9 is an exploded view of a sub-assembly of a light engine chiplet with reduced lateral dimension according to an embodiment of the present invention. This diagram is merely an example, which should not unduly limit the scope of the claims. One of ordinary skill in the art would recognize many variations, alternatives, and modifications. Referring to FIG. 9, the packaging assembly 8000A of the light engine chiplet includes a vertical stacking assembly of multiple chips on separate component substrates unlike the light engine chiplet 2000A for keeping the CMOS chips, SiPho chip, and PLC block on a single sub-module substrate 2300A (see FIG. 8). As an example, the packaging assembly 8000A includes a lid member 8100 configured with a top plate 8101 connected to four side walls 8105. At least one side wall 8105 includes an opening port 8110 configured to allow an optical connector (see FIG. 10 below) to plug in. The lid member 8100 also includes an optical connector interface structure (not visible) under the top plate 8101 coupled to the open port 8110 to allow at least one optical output and one optical input to be aligned with the respective pathways of the optical connector. Optionally, the optical connector interface is a parallel fiber interface. Optionally, the lid member 8100 is also made as a heat sink. Optionally, the top plate 8101 can be made by a high-thermal-conductivity material to serve as the heat sink for efficiently transfer heat out of the packaging assembly 8000A. Optionally, additional thermal conductive structure is fabricated on top of the top plate 8101 to serve as a heat sink that fit in various systems such as optical switch module with co-packaged light engines in a rack chassis.

Referring to FIG. 9, the light engine chiplet in the packaging assembly 8000A includes a first component substrate 8200 integrating an application-specific integrated circuit (ASIC) chip including a digital signal processing (DSP) chip, optionally a microcontroller chip, and host/line interface IC in a CMOS platform (e.g., 5 nm process). The DSP chip is at least configured to serve as a digital signal processing interface of the light engine functioned as an optical-electrical transceiver. A host interface integrated in the first component substrate 8200 is configured to perform data interconnect operation with an extra-short reach (XSR) or equivalent protocol to interact with system processor or electrical host. A line interface integrated in the first component substrate 8200 is configured to support PAM optical reach (POR) control of the light engine operation. Optionally, the DSP chip also includes Physical Code Sublayer (PCS) or Physical Medium Attachment (PMA) layers for data encoding and decoding or many other digital signal processing operations. Optionally, the first component substrate 8200 is disposed as a top die of the stack-up component substrates (dies) at a nearest position under the lid member 8100. Optionally, the first component substrate 8200 also integrates modulator driver and microcontroller directly into the DSP chip. Optionally, the DSP function in the ASIC chip is incorporated to a system processor and the first component substrate 8200 only retains integrated modulator driver and transimpedance amplifier function. Optionally, the ASIC chip includes SerDes chip for coding and encoding data through the DSP interface.

Referring to FIG. 9, the light engine chiplet in the packaging assembly 8000A includes a second component substrate 8300 integrating an application-specific integrated circuit (ASIC) control chip and a third component substrate 8400 integrating a TIA chip, both being disposed below the first component substrate 8200. Optionally, the TIA chip is coupled to bottom conductive contacts of the first component substrate 8200 via a set of bumps 8410 on the third component substrate 8400. The ASIC control chip is configured to couple to bottom of the first component substrate 8200 via another set of bumps 8310 on the second component substrate 8300. The second component substrate 8300 and the third component substrate 8400 (or maybe a combined substrate) thus are disposed as a middle die under the top die of the stack-up component substrates in the packaged assembly 8000A. Optionally, the TIA chip is reduced in size and mounted or integrated into a silicon photonics (SiPho) chip below and the ASIC control chip in the second component substrate 8300 may be integrated into the DSP chip in the top die in the first component substrate 8200. Optionally, the TIA chip may be also integrated into the DSP chip in the top die associated with the first component substrate 8200. In this case, the middle die of the stack-up can be eliminated.

Referring to FIG. 9, the light engine chiplet in the packaging assembly 8000A includes a fourth component substrate 8500 made by a silicon photonics substrate integrating various Si or SiGe-based waveguide devices such as optical modulators and photodetectors. Optionally, the fourth component substrate 8500 by itself forms a SiPho chip as an individual die in the stack-up. Optionally, the SiPho chip is coupled via a set of bumps 8510 to the ASIC control chip in the second component substrate 8300 for controlling the operation of DSP chip or TIA chip. The SiPho chip is also coupled via a set of bumps 8512 to the TIA chip in the third component substrate 8400 for passing the incoming optical signals to the photodetectors which generate photocurrent signals for the TIA chip. Optionally, the SiPho chip in the fourth component substrate 8500 also directly integrates multiple, e.g., four, laser chips as light sources to provide multiple optical channels of the optical-electrical transceiver for optical data communication, a designated function of the light engine chiplet. Optionally, the laser chips, especially, high-powered laser chips can be disposed outside the packaging assembly 8000A. Optionally, the fourth component substrate 8500 is disposed as a bottom die under the middle die more distal to the top die in the stack-up in the packaging assembly 8000A. Optionally, as the middle die is partially absorbed into either the top die or bottom die, for example, the ASIC control chip is incorporated into the DSP chip and the TIA chip is reduced in size and mounted or embedded into the SiPho chip, the bottom die associated with the fourth component substrate 8500 may be directly coupled with the top die associated with the first component substrate 8200. Alternatively, the first component substrate 8200 is disposed as a bottom die while the fourth component substrate 8500 can be disposed as a top die in the stack-up in the packaging assembly 8000A.

Referring to FIG. 9, the light engine chiplet in the packaging assembly 8000A includes a sub-module substrate 8600 served as a bottom member of the packaged assembly 8000A. The sub-module substrate 8600 is provided as a micro land grid array (LGA) substrate which includes a matrix array of conductive socket contacts 8610 convenient for chip testing and surface-mount packaging assembly. Optionally, the micro-LGA substrate is also designated for mounting the light engine chiplet onto a module substrate by connecting the conductive socket contacts to a printed circuit board line card designed for being used in an optical network system in a rack chassis. Optionally, the sub-module substrate 8600 is a 2.5 D substrate having through-vias to connect all active components without any wire bonding. Optionally, power regulators and decoupling capacitors may be integrated into ASIC chips such as the digital signal processing chip as no power supplies are provided in the micro-LGA substrate for the light engine chiplet in this compact packaging assembly 8000A. Optionally, all components in the packaging assembly 8000A as described above has a lateral dimension substantially limited by the sub-module substrate 8600. It is desired to push the lateral dimension smaller and smaller except that high-powered laser may have to be mounted externally instead of integrated in the SiPho chips therein. In an example, the lateral dimension is as small as 10 mm×10 mm.

Figure 10:
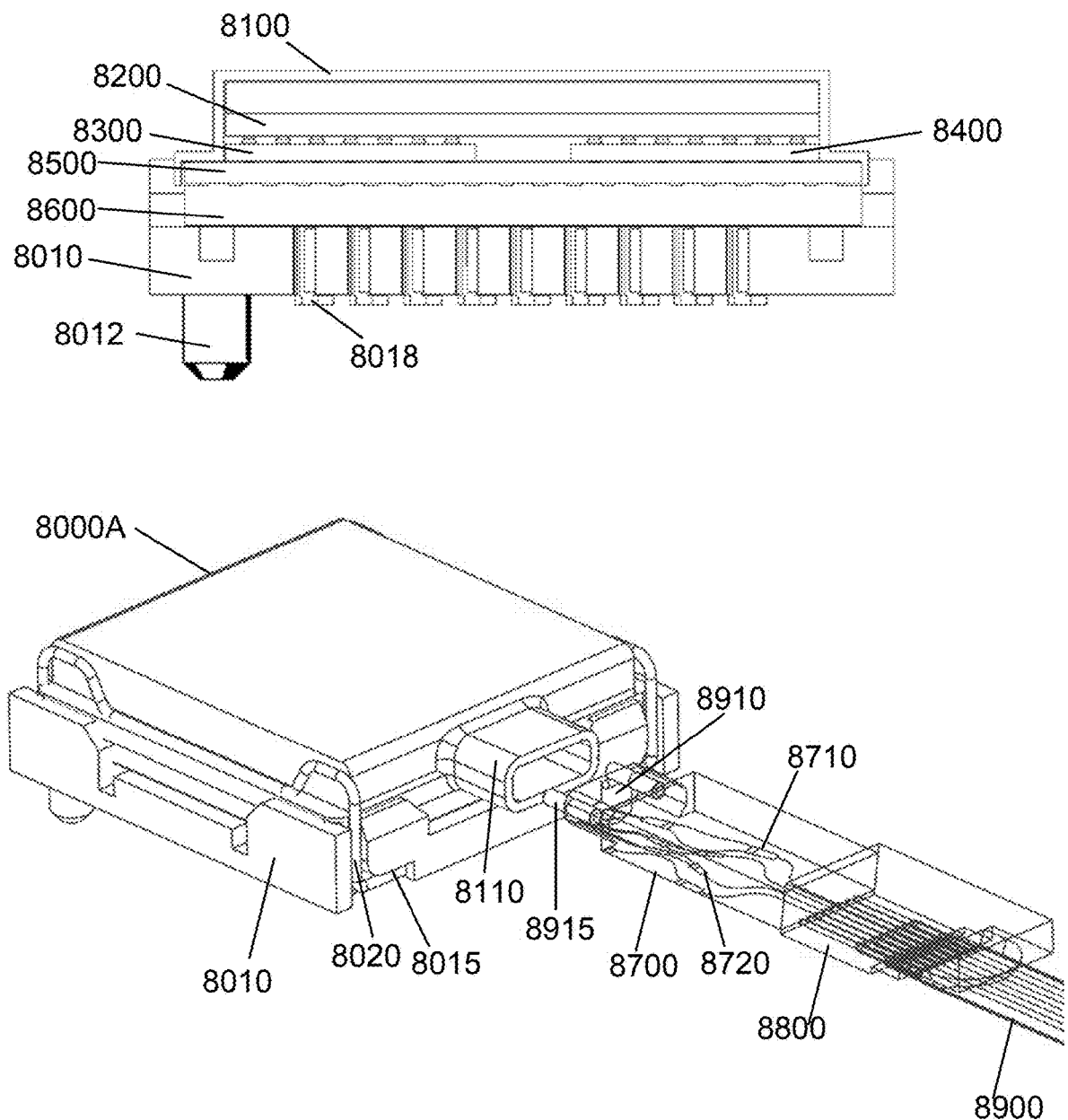
FIG. 10 is a cross-section view of the light engine chiplet of FIG. 9 clamped in a socket base and a perspective view of it configured to couple with an external PLC block integrated in an optical connector according to an embodiment of the present invention.

Referring to part C of FIG. 8 and FIG. 9, the sub-module substrate 8600 for supporting the light engine chiplet 8000 is reduced in size comparing to that 2300A for supporting the light engine 2000A or 4000A. In these embodiments, the sub-module substrate, for example, a dimension of the sub-module substrate is only 10 mm×10 mm. The substrate with such a small dimension may not have room for mounting a PLC block like one PLC 200 in the light engine chiplet 2000A or 4000A. The PLC block containing at least a multiplexer and a demultiplexer in planar light circuit form is served as a key component of an optical line interface that needs to be coupled with the SiPho chip in the light engine chiplet operated as a multi-channel optical-electrical transceiver. Unlike the light engine (2000A or 4000A) packaged on a larger sub-module substrate, FIG. 10 shows, in a perspective view at bottom, that the light engine chiplet of FIG. 9 is configured to couple with an external PLC block integrated in an optical connector according to an embodiment of the present invention. This diagram is merely an example, which should not unduly limit the scope of the claims. One of ordinary skill in the art would recognize many variations, alternatives, and modifications. In an embodiment, as shown in FIG. 10, a PLC block 8700 is disposed outside the packaging assembly 8000A of the light engine chiplet. The PLC block 8700 includes at least a multiplexer 8710 and a demultiplexer 8720 formed as planar waveguide devices on a glass substrate. One end of the PLC block 8700 is coupled to a coupling head 8910 with two alignment pins 8915 being plugged into two sockets in the optical port 8110 and allowed several on-board fibers (not shown) to couple with the multiplexer 8710 and a demultiplexer 8720 and with respective output/input waveguides in the SiPho chip in the light engine chiplet. Another end of the PLC block 8700 is coupled to an optical adaptor 8800 which aligns the planar waveguide devices in the PLC block 8700 to corresponding in/out optical fibers. A fiber cable 8900 is configured to pack all in/out optical fibers together and connected to an optical connector for connecting to an optical network system.

FIG. 10 also shows, in a cross-section view at top, that the packaging assembly 8000A of the light engine chiplet is clamped in a socket base member 8010. As shown, under the lid member 8100, a stack-up of multiple dies are assembled together including a DSP die plus host interface in the first component substrate 8200 on the top, controller chip in a second component substrate 8300 and a TIA chip in the third component substrate 8400 side-by-side in the middle, and a SiPho die in the silicon photonics substrate 8500 at the bottom on the sub-module substrate 8600 which serves as a bottom member. The socket base member 8010 includes several bottom notches 8015 (seen in the perspective view) configured to allow a shaped metal wire 8020 to clamp the packaging assembly 8000A with spring force onto the socket base member 8010. The socket base member 8010 also includes alignment pins 8012 (seen in the cross-section view) at the bottom thereof used for disposing the clamped packaging assembly of the light engine chiplet onto a pre-defined location in a module substrate (e.g., a switch substrate). The socket base member 8010 also includes a plurality of thru-vias configured to have conductor pins or wires 8018 installed for forming proper electrical connection between the packaging assembly 8000A of the light engine chiplet and a module processor/controller (not shown) on the same module substrate. Optionally, the lateral dimension of the socket base member 8010 holding the packaged assembly 8000A is substantially 10 mm×10 mm.

In still another aspect, the present disclosure provides a co-packaged optical module with a switch processor and multiple light engine chiplets commonly mounted on a switch substrate for extra short reach interconnect or equivalent protocol in high-speed data communication. With obvious benefit of reduced interconnect loss (<10 dB) insight, optics based on silicon photonics platform is brought closer and closer to a switch processor for meeting demands on increasing data rate in high-speed data communication. As shown in FIG. 9 and FIG. 10, a light engine configured as a multi-channel optical-electrical transceiver can be integrated on a compact sub-module substrate based on 2.5 D LGA in a chiplet packaging assembly. An external PLC block can be provided in an integrated optical connector to couple with on-board fibers connected to SiPho chip in the light engine. Optionally, the light engine can use host FEC to draw control signals without using gear box or retimer module. Such light engine chiplet packaged as shown in FIG. 8 and FIG. 9 can be operated independently as multiple replicable units for providing desired number of optical signal lines or channels needed for Ultra-Short-Reach (USR) or Extra-Short-Reach (XSR) or equivalent protocol in electrical host interconnect operation via a single switch processor to communicate with multiple hosts and lines in one modular setting.

Figure 11:
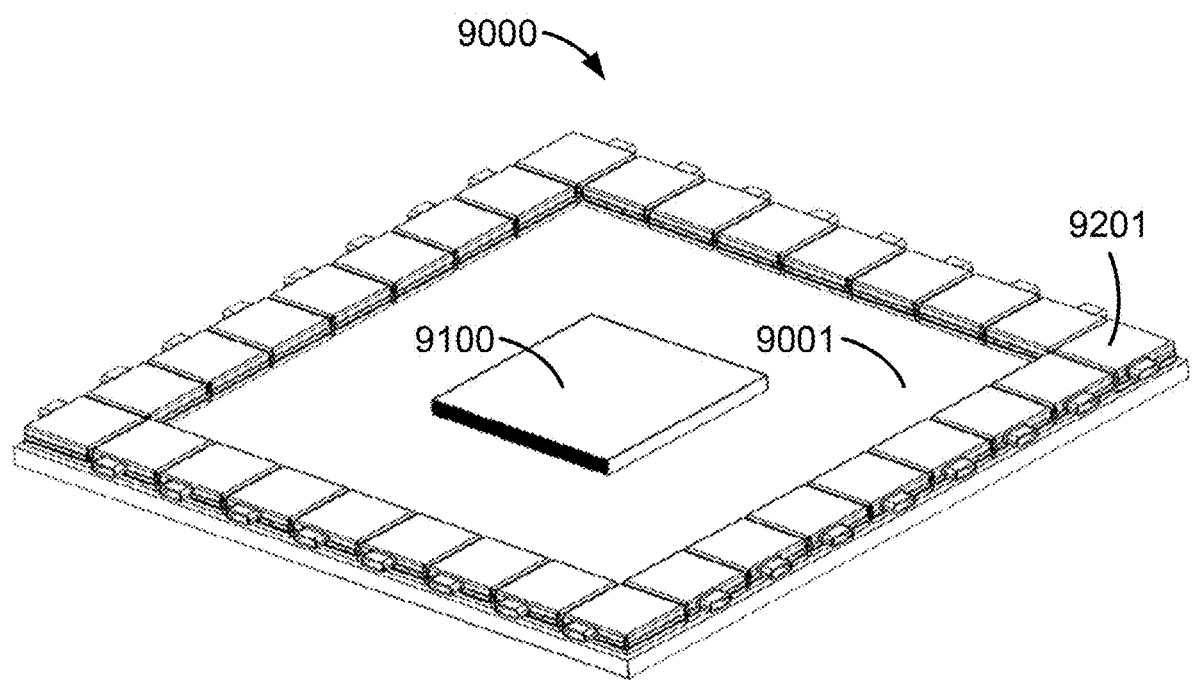
FIG. 11 is a perspective view of a switch module with a processor co-packaged with multiple light engines commonly on a switch substrate for extra short reach data communication according to an embodiment of the present invention.

FIG. 11 is a perspective view of a co-packaged optical module of a switch processor mounted with multiple light engines commonly on a switch substrate for extra short reach or equivalent protocol in data communication according to an embodiment of the present invention. This diagram is merely an example, which should not unduly limit the scope of the claims. One of ordinary skill in the art would recognize many variations, alternatives, and modifications. As an embodiment shown in FIG. 11, the co-packaged optical (CPO) module 9000 is provided by integrating one switch processor 9100 with multiple packaged light engine chiplets 9201 commonly on a switch substrate 9001. In an embodiment, the switch processor 9100 is mounted in a central site of the switch substrate 9001 while all the multiple packaged light engine chiplets 9201 are substantially evenly distributed at periphery sites on the switch substrate 9001 surrounding the switch processor 9100. Optionally, the switch substrate 9001 is in a square shape having four peripheral sides for mounting equal-number of the packaged light engine chiplets 9201 per side. Each packaged light engine chiplets 9201 is substantially the same as one packaging assembly 8000A of a multi-channel optical-electrical transceiver provided in FIG. 9 being clamped in a socket base member 8010 as shown in FIG. 10. Each clamped chiplets is mounted into the switch substrate 9001 by using a couple of alignment pins (8012, see FIG. 10) at bottom of the socket base member 8010.

In a specific embodiment, each packaged light engine chiplets 9201 includes an optical connector port for plugging-in an optical connector head that is coupled to a PLC block to serve its optical line interface for the multi-channel optical-electrical transceiver. Optionally, each chiplet integrates four laser chips in a silicon photonics substrate to provide four CWDM wavelengths corresponding to four optical channels of the optical-electrical transceiver. Optionally, four 1-to-2 splitters can be added to split each laser light to two to provide four more replicate optical channels with the same four CWDM wavelengths. Optionally, each chiplet can integrate four more laser chips or choose four 1-to-4 splitters for four high-powered laser chips to yield 8 or 16 channels. Each light engine chiplet can fully be operated independently with its own controller and driver. Thus, in the co-packaged optics configuration as shown in FIG. 11, one switch processor can be co-packaged with some pre-determined numbers of light engine chiplets on the same switch substrate depending on designed processor with maximum die size and data handling capacities in one co-packaged switch module in a rack chassis for different applications. Referring to the example shown in FIG. 11, one switch processor 9100 is co-packaged with 8 light engine chiplets 9201 on each of peripheral sides of a switch substrate 9001. If each light engine chiplet has 8 channels with 200 Gbit/s per channel or 16 channels with 100 Gbit/s per channel, the single packaged chiplet 9201 provides 1.6 Tbit/s capacity and the co-packaged optical (CPO) module 9000 is enabled for 51.2 T operation. In an alternative example, one switch processor can be co-packaged with one light engine chiplets on each of peripheral sides of the switch substrate for switch and optical interconnect, then the CPO module is enabled for 6.4 T operation. Optionally, a CPO module can be enabled for 25.6 T operation by co-packaging one switch processor with four light engine chiplets on each of peripheral sides of the switch substrate for switch and optical interconnect.

In an embodiment, a goal of moving optical-electrical module closer and closer to the switch processor from using pluggable optical module with gear box or retimer to on-board in-package optics and further to the co-packaged optical module that eliminates the gear box or retimer is to reduce power loss (from 20 to 35 dB down to <10 dB) depended on the range of interconnect and substantially reduce power consumption per bit from about 5.0 pJ/bit to <1.8 pJ/bit. Since the switch processor has its own limits on package size especially when its operation capacity is increased to 51.2 T generation, a requirement for smaller total module package size and push for smaller distance between the switch processor and each light engine co-packaged naturally put limitations on both the size of switch substrate and the size of light engine (or sub-module) substrate.

Figure 12:
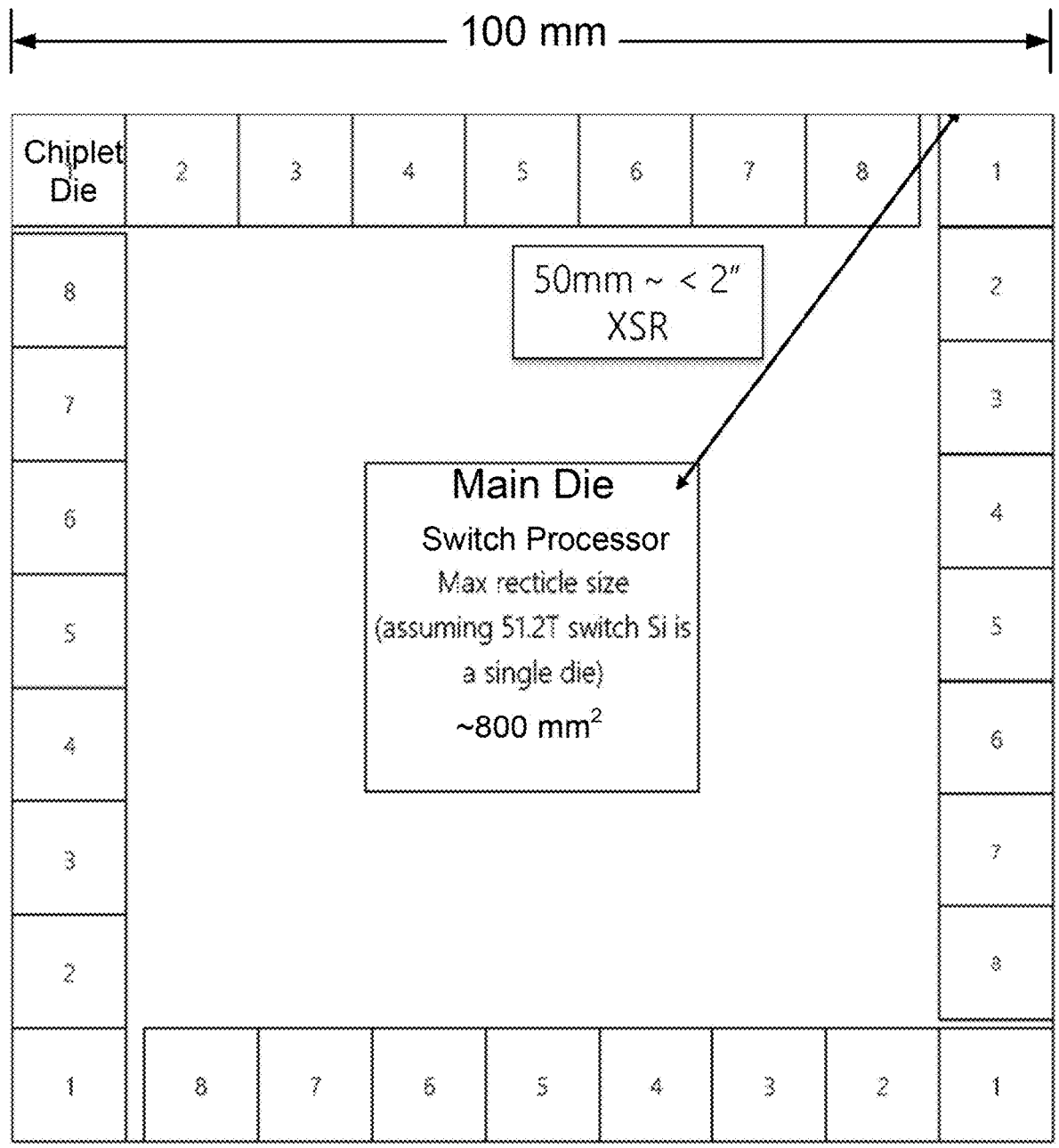
FIG. 12 is a schematic top view of the switch module of the FIG. 11 with a capacity of 51.2 Tbit/s on a switch substrate integrating eight light engine chiplets per each peripheral side of the switch substrate according to the embodiment of the present invention.

FIG. 12 shows a top view of a schematic co-packaged switch module co-packaged with 32 packaged light engine chiplets (average 8 chiplets per side) with 1.6 T capacity per light engine commonly on a 100 mm×100 mm switch substrate. The switch processor has a reticle size of about 800 mm² for achieving the 51.2 Tbit/s total throughput in single die to be compatible with the 32 packaged light engines each independently with 1.6 Tbit/s capacity. To fit in the length of 100 mm for every peripheral edge, each packaged light engine chiplet is limited to an area of about 10 mm×10 mm. Referring to FIG. 9 and FIG. 10, each light engine chiplet is in-packaged with minimum functionality of digital processing/host interface with enabled Extra-Short-Reach (XSR) or Physical Code Sublayer (PCS) or Physical Medium Attachment (PMA) layers in the DSP chip to reduce the sub-module substrate to 10 mm×10 mm. Optionally, the driver/TIA chips also are reduced their footprint in the chiplet with a stack-up mounting scheme or are incorporated completely into the DSP chip. Depending which chiplet among each peripheral side of the 100 mm×100 mm switch substrate, the maximum distance from the switch processor die edge to furthest light engine chiplet is smaller than 50 mm. As the result, a most-compact switch module with 51.2 Tbit/s total throughput based on the 10 mm×10 mm 1.6 Tbit/s light engine is shown in FIG. 11 and FIG. 12. In general, for a given total data throughput of a co-packaged switch module with a configuration of a plurality of chiplet dies surrounding a main processor die in the central location, each chiplet die is preferred to have a minimum die size to allow a maximum number of chiplet dies disposed densely on the module substrate with a distance of any chiplet die from the main die as small as possible for extra-short-reach or equivalent protocol in data interconnect operation. Also, each chiplet die is preferred to have higher data capacity so that smaller numbers of chiplet dies are needed.

Note, for each 10 mm×10 mm 1.6 T light engine, 4 (or even 8) laser chips can still be integrated inside the chiplet package (FIG. 9 and FIG. 10) to provide 4 (or 8) CWDM wavelengths. While a compact multiplexer/demultiplexer optical interface is developed to be integrated into an optical connector that plugs into an optical port of each light engine chiplet to save space. As shown in FIG. 11, each light engine chiplet 9201 has its optical port facing outward to allow the optical connector to be plugged-in (see FIG. 10). Optionally, 4 remote high-power laser sources are provided externally via 4 fibers. Optionally, each laser can be split 8 ways to provide 32 100 G/k lanes. Optionally, each laser can be split 4 ways to provide 16 200 G/k lanes. In these options, 3.2 Tbit/s per light engine can be enabled.

Figure 13:
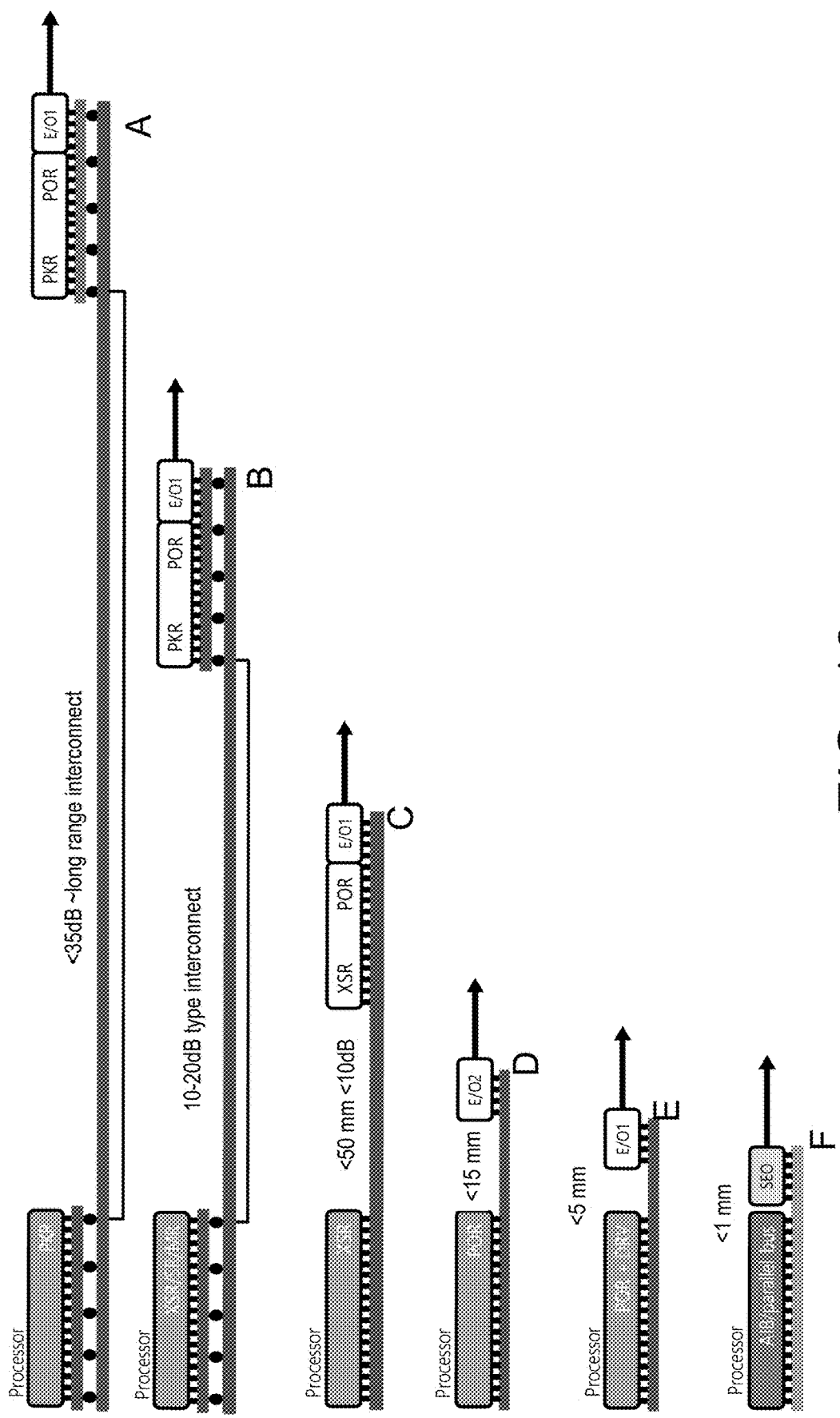
FIG. 13 is a schematic diagram illustrating evolved integration schemes of moving light engines closer to a switch processor for reducing interconnect reach distance in high-speed data communication applications according to some embodiments of the present invention.

FIG. 13 is a schematic diagram illustrating evolved integration schemes of moving light engines closer to a switch processor for reducing interconnect reach distance in high-speed data communication applications according to some embodiments of the present invention. This diagram is merely an example, which should not unduly limit the scope of the claims. One of ordinary skill in the art would recognize many variations, alternatives, and modifications. In some scenarios (A and B) of the embodiment, the switch processor, no matter it is configured for PAM backplane reach (PKR) operation or extra-short-reach (XSR)/short reach (SR)/medium reach (MR) operation with each light engine enabled with 100 Gbit/s per wavelength in one optical lane, can be deployed alone on a switch substrate which is connected over a certain range of interconnect via gear box or retimer in-packaged with multiple light engines on a separate line card. Optionally, the multiple light engines are packaged four quadrants of optical-electrical sub-modules as shown in FIG. 4, FIG. 5, and FIG. 6 with each quadrant sub-module carrying 0.8 Tbit/s in 8 optical lanes. The certain range of interconnect includes long-range interconnect involving optical loss of 35 dB or less in the scenario A, or medium-range interconnect involving optical loss of 25 dB or less, or short or extra-short range of interconnect involving optical loss of about 10 dB in the scenario B with each quadrant sub-module being improved to 1.6 Tbit/s in 8 optical lanes. The optical line interface can employ a PAM optical reach (POR) or equivalent protocol and the electrical host interface can include a PAM backplane reach (PKR) or equivalent protocol under a same setting of line/host interface scheme for the scenarios of A and B.

In some other scenarios (C through F) of the embodiment, the switch processor is co-packaged with multiple light engines in a much closer distance on a same switch substrate to form a co-packaged optical (switch) module which can be deployed to a network system in a single rack chassis. No gear box or retimer is required while host FEC is used in digital signal processing with 56 Gbaud electrical interface. Each light engine in the scenario C of the embodiment includes a silicon photonics chip packaged with a TIA chip and modulation driver chip and stacked up with a digital signal processing (DSP) chip above or under the silicon photonics chip. Optionally, the DSP chip is configured with a host interface, PCS/PMA layers, and a line interface for PAM optical reach operation. The switch processor in this scenario is configured with DSP interface for 51.2 T operation (see FIG. 11) disposed to a central area of a 100 mm×100 mm switch substrate with each of 32 light engines (each of 1.6 Tbit/s capacity) being distributed around peripheral regions of the switch substrate. Each light engine is limited in a packaged chiplet of 10 mm×10 mm carrying 1.6 Tbit/s (see FIG. 12) including 4 in-packaged lasers and an externally coupled multiplexer/demultiplexer optical interface integrated in an optical connector. The switch processor is connected with each of the 32 light engines with a maximum distance of <50 mm via in-substrate interconnect in the switch substrate, yielding a power loss of <10 dB and compatibility with the 51.2 T extra-short-reach (XSR) or equivalent protocol in data interconnect operation designed for the switch processor. Optionally, the switch processor can be connected with 16 light engines of 3.2 Tbiy/s capacity to have 51.2 T total data throughput.

Alternatively, the scenarios D through F illustrate options of pushing the light engine closer and closer to the processor with switch substrate or light engine substrate sizes being adjusted depending on individual light engine chiplet die sizes. Each light engine chiplet is assumed to maintain 100 Gbit/s per wavelength in each optical lane. In a specific embodiment, the light engine in the scenario D includes a silicon photonics chip and transimpedance amplifier with externally coupled laser sources driven by analog driver and external multiplexer/demultiplexer optical interface to connect via on-board fibers to an optical connector, while eliminating retimer function within the light engine. Optionally, each light engine can be provided in a packaged chiplet form with a smaller individual die size. Optionally, the light engine includes an external SiGe-based modulation driver with relatively higher power consumption. Optionally, the light engine includes an external CMOS driver integrated in the switch processor to reduce the power consumption. The switch processor in the scenario D incorporates the DSP host interface only without FEC function while implementing PAM optical reach. Optionally, the switch substrate size can be reduced further depending on individual light engine die size and throughput setting per light engine. In an example, each light engine still provides 1.6 Tbit/s, thus, the switch module still needs 32 light engines to have 51.2 Tbit/s total throughput. In another example, each light engine is expanded to 3.2 Tbit/s, the co-packaged switch module needs just 16 light engines to have 51.2 Tbit/s total throughput. As the result, a maximum distance between the switch processor and one of the multiple light engine chiplets co-packaged in the scenario D may be reduced further. In an example, the distance is smaller than 15 mm to push even lower optical power loss in the XSR interconnect operation.

Additionally, in the scenario E, the light engine includes a silicon photonics chip packaged with a TIA chip only while moving the modulation driver into CMOS chip associated with the switch processor. The individual die size may be further reduced as the lasers and optical interface can all be coupled externally. The switch processor in the scenario E incorporates the DSP host interface to interact with electrical host yet without FEC function and analog modulation driver to control laser signals while implementing PAM optical reach. As the result, a maximum distance between the switch processor and one of the multiple light engine chiplets co-packaged in the scenario E may be reduced even further. In an example, the distance is smaller than 5 mm to push even lower optical power loss in the extra-short-reach (XSR) or equivalent protocol in data interconnect operation and lower power consumption per module with the same 51.2 Tbit/s total throughput.

Furthermore, in the scenario F, the light engine is packaged by integrating the silicon photonics chip with a Serializer/Deserializer (SerDes) block and a TIA chip in the packaged chiplet. The SerDes block provides data transmission over a single line or a differential pair in order to minimize the number of I/O pins and interconnects. The data speed per line can be 56 Gb/s or 112 Gb/s. Optionally, the SerDes block includes digital encoding/decoding blocks. Accordingly, the switch processor in this scenario F employs Advanced Interface Bus (AIB) or parallel bus with packages to allow heterogeneous integration of multiple die into a single package to connect the analog front-end, signal preprocessing, to interface with Ser/Des block in each light engine chiplet for ultra-short-reach (USR interconnect operation. In the scenario F, between the switch processor and the multiple light engine chiplets, an active Si interposer is inserted. The active Si interposer extends the concept of Chip-on-Wafer-on-Substrate (CoWoS) technology based on a 2.5 D or 3 D integrated circuit employing through-silicon via (TSV) interposer-based packaging technology to provide reticle matching the total module size and to hold the main switch processor die and all chiplet dies. Optionally, the active Si interposer contains a grid of TSVs to connect IOs and supply plus active regions to pass signals using buffers between two grids of conductive contacts formed according to the design of the main processor die and multiple dies of light engine chiplets as shown in FIG. 11 and FIG. 12. Optionally, the active Si interposer also can support connecting multiple main dies on one package substrate. With the active Si interposer, the light engine dies can be brought to the switch processor as close as <1 mm for establishing USR-type interface.

Figure 14:
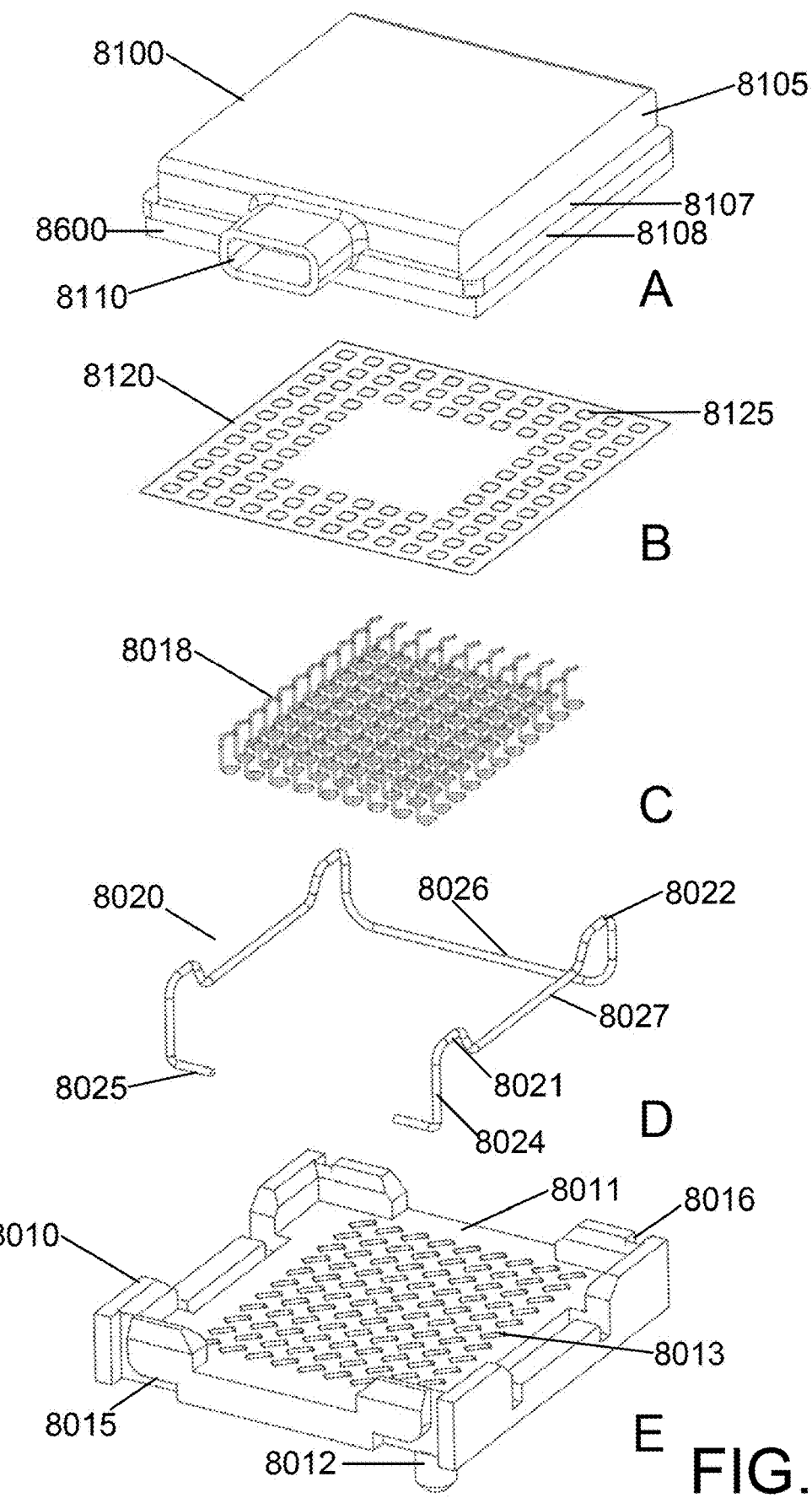
FIG. 14 is an exploded view of all parts of a package of a light engine chiplet to illustrate a method of packaging one of the multiple light engines in the co-packaged switch module according to an embodiment of the present invention.

FIG. 14 is an exploded view of all parts forming a packaged light engine chiplet as one of the multiple light engines in the co-packaged switch module according to an embodiment of the present invention. This diagram is merely an example, which should not unduly limit the scope of the claims. One of ordinary skill in the art would recognize many variations, alternatives, and modifications. As shown, the package includes an assembly of part A through part E as a packaged light engine chiplet ready for being mounted on the same switch substrate with multiple other light engine chiplets. The part A of the package is a sub-assembly of the light engine chiplet, which is substantially same as the sub-assembly 8000A described in FIG. 9. In a perspective view of the sub-assembly, it shows a lid member 8100 on top attached on a sub-module substrate 8600 at bottom to enclose a light engine therein. Optionally, the sub-module substrate 8600 is a micro Land Grid Array (LGA) type substrate designated for mounting the light engine chiplet onto a module substrate. Optionally, the light engine enclosed in the sub-assembly is configured as a multi-channel optical-electrical transceiver including or coupling to multiple laser chips on a silicon photonics substrate to provide multiple CWDM wavelength channels. Optionally, the light engine enclosed the sub-assembly is configured to be operated with a data rate capacity of 1.6 Tbit/s or 200 Gbit/s for 8 optical lanes.

Referring to FIG. 14, the lid member 8100 is shown with more structural elements that play respective roles to be assembled with other parts in the package of the light engine chiplet. For example, the lid member 8100 includes at least two straight side edges 8105 on two opposing sides naturally connected a front edge with an optical port 8110 and a back edge. Each side edge 8105 stands vertically on a ledge structure, i.e., a flat horizontal portion 8107 joined with a smaller vertical portion 8108. The ledge structure can be utilized by other parts for fixing the sub-assembly in the package.

The part B in the package of FIG. 14 is an interposer pad 8120 configured to connect a micro LGA type substrate at its top side with a printed circuit board below. In the package of FIG. 14, the interposer pad 8120 with an array of patterned holes 8125 is inserted below the sub-module substrate 8600 to provide capability to mate and de-mate the light engine chiplet being surface-mounted on the co-packaged substrate or printed circuit board.

The part C in the package of FIG. 14 includes a plurality of connection pins 8018 with small pitch size and low profile to provide connection paths for electrical signals between the light engine and circuits in the switch substrate and other chips mounted on the switch substrate. The plurality of connection pins 8018 is arranged in a matrix array designed to match the interposer pad 8120 compatible for high-speed (56 Gbaud/s and higher) and high-power data communication. The matrix array of connection pins 8018 are respectively disposed at a matrix of through holes in the part E which is configured as a socket base member 8010 at the bottom of the package.

The part D in the package of FIG. 14 is a shaped metal wire 8020 for clamping the part A, i.e., a sub-assembly 8000A of the light engine chiplet, into the part E, the socket base member 8010. In particular, the socket member 8010 includes a flat plate 8011 with a matrix of through holes 8013 compatible with the LGA-type interposer pad 8120 for forming proper electrical connections with the LGA-type substrate 8600 of the sub-assembly 8000A. The matrix array of connection pins 8018 are disposed into respective through holes 8013 in the flat plate 8011 so that the interposer 8120 can be placed on top to form interconnect with respective electrical contacts at the bottom side the sub-module substrate 8600 as the sub-assembly of the light engine is disposed on the interposer 8120 in the socket base member 8010. In addition, the matrix array of connection pins 8018 also form respective conduction paths to connect the light engine with electrical contacts on a module substrate (such as the switch substrate 9001 in FIG. 11) in a co-packaged optical module (such as CPO module 9000 in FIG. 11).

In the embodiment, the shaped metal wire 8020 is a single wire shaped with at least a horizontal backside section 8026 extended to substantially entire length of the back wall of the socket base member 8010, two bended back sections 8022 connected to respective ends of the horizontal backside section 8026, two horizontal side sections 8027 respectively connecting the two bended back sections 8022 to two bended front sections 8021. Each bended front section 8021 further is extended downward to a vertical section 8024 which is coupled to an end section 8025 with a length much shorter than entire length of the front wall bended from the vertical section 8024 to horizontal direction along the front wall of the socket base member 8010.

The part E, i.e., the socket base member 8010, is configured to have some slot/notch structures at both the front wall and back wall respectively matching the two bended front sections 8021 including the vertical section 8024 and the end section 8025 and two bended back sections 8022 including the horizontal backside section 8026. A bottom notch (not visible in FIG. 14) formed in the back wall of the socket base member 8010 is designed to hold the horizontal backside section 8026 of the shaped metal wire 8020 so that the two bended back sections 8022 are fitted in respective two back slots 8016. The bended front or back sections of the shaped metal wire 8020 may generate desired elastic forces depending on bending angle and mechanical tensile strength of the metal wire with a certain diameter. Accordingly, the two horizontal side sections 8027 are forced to land on the two flat horizontal portion 8107 of two side ledges of the lid member 8100 (provided that the sub-assembly 8000A is disposed in the socket base member 8010 in the package of FIG. 14). Furthermore, the two bended front sections 8021 of the shaped metal wire 8020 connect to the two end sections 8025 respectively via two vertical sections 8024 so that the two end sections are respectively held by two bottom notches 8015 on the front wall of the socket base member 8010 to force the two horizontal side sections 8027 on the two flat horizontal portion 8107 of the lid member 8100 to clamp the sub-assembly (part A of FIG. 14) of the light engine chiplet in the socket base member 8010.

Moreover, the socket base member 8010 includes a couple of registration pins 8012 designed to mate with a compatible registration holes in the module substrate or printed circuit board (such as a switch substrate 9001 in FIG. 11) to allow the packaged light engine chiplet being surface mounted in the co-packaged optical module. Optionally, the two registration pins 8012 are located at two diagonal positions at the bottom side of the socket base member 8010. As the socket base member 8010 is mated with a sub-module site in the module substrate via the registration pins 8012, the matrix array of connection pins 8018 also have their respective bottom contacts to form electrical connections between the light engine and the module substrate.

Figure 15:
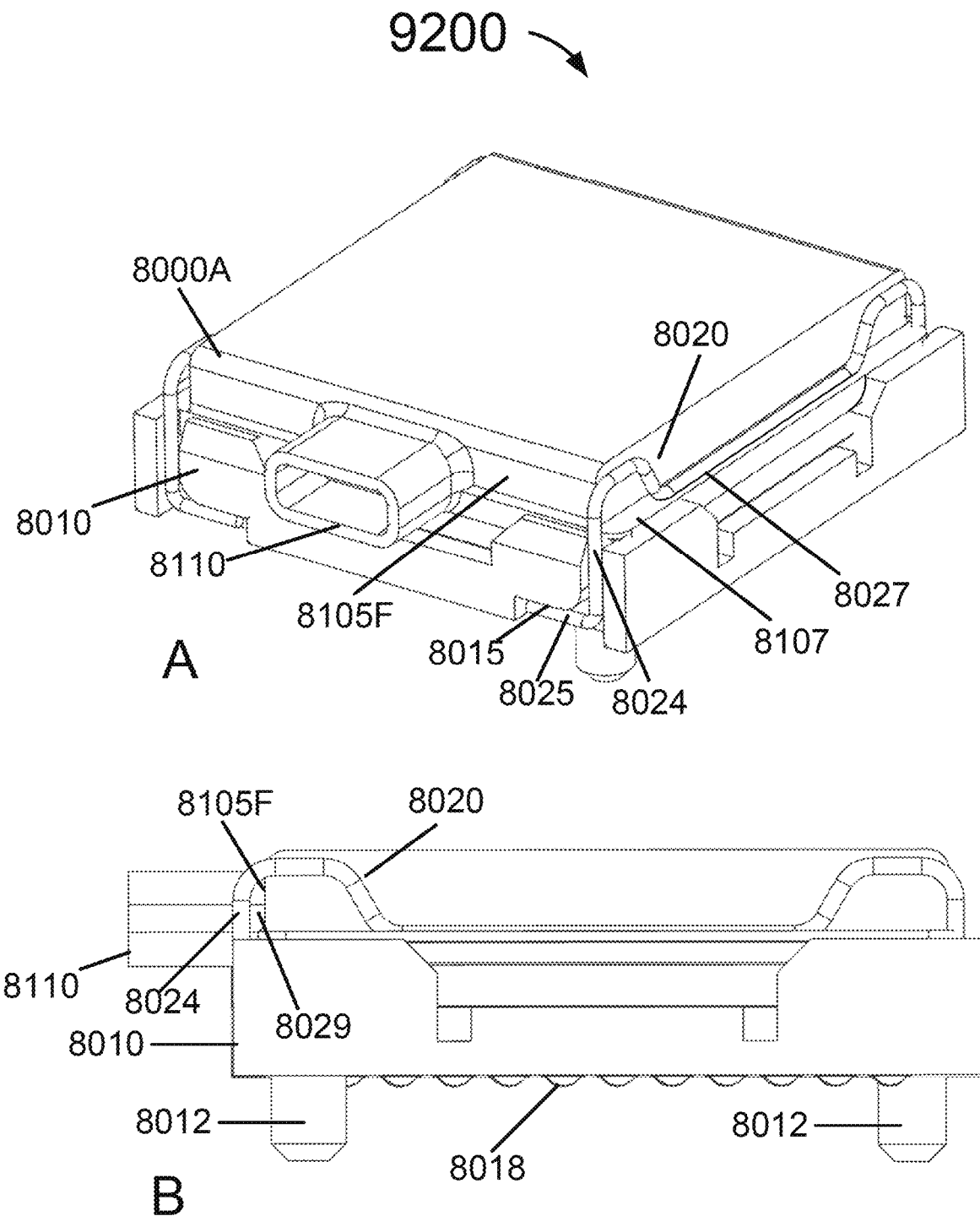
FIG. 15 is (A) a perspective view and (B) a side view of the packaged light engine chiplet of FIG. 14 according to an embodiment of the present invention.

FIG. 15 shows a perspective view (part A) and a side view (part B) of the packaged light engine chiplet of FIG. 14 according to an embodiment of the present invention. This diagram is merely an example, which should not unduly limit the scope of the claims. One of ordinary skill in the art would recognize many variations, alternatives, and modifications. As shown in part A of FIG. 15, the packaged light engine chiplet 9200 is a package assembled all the parts A through E shown in FIG. 14. In particular, the shaped metal wire 8020 (see part D of FIG. 14) is applied to clamp the sub-assembly 8000A (part A of FIG. 14) of the light engine into the socket base member (part E) by pressing the horizontal side section 8027 onto the flat horizontal portion 8107 of the ledge structure of the lid member 8100 and locking the end section 8025 into the front-wall bottom notch 8015. Optionally, the front side 8105F of the sub-assembly 8000A of light engine chiplet includes an optical port 8110. Optionally, the packaged light engine chiplet 9200 substantially the same as each of the multiple light engines 9201 co-packaged with a switch processor 9100 commonly on a switch substrate 9001 to form the co-packaged optical module 9000 of FIG. 11.

The part B of FIG. 15 shows a side view of the same packaged light engine chiplet 9200. In the embodiment, the vertical section 8024 of the shaped metal wire 8020 is positioned slightly ahead of the front edge 8105F to leave a gap 8029 between them. This design allows a releasing mechanism to be applied for optional releasing the sub-assembly 8000A from the packaged light engine chiplet 9200 when the latter is one of multiple light engine chiplets 9201 disposed in the co-packaged optical module to mate with the module substrate via the couple of registration pins 8012. In the side view shown in the part B of FIG. 15, two registration pins 8012 can be seen. Optionally, the couple of registration pins 8012 are positioned along a diagonal direction of the socket base member 8010. Also, a plurality of conduction pins 8018 with respective bottom contacts can be seen in this side view diagram of the packaged light engine chiplet 9200 to form electrical connections between the light engine and the module substrate.

Figure 16A:
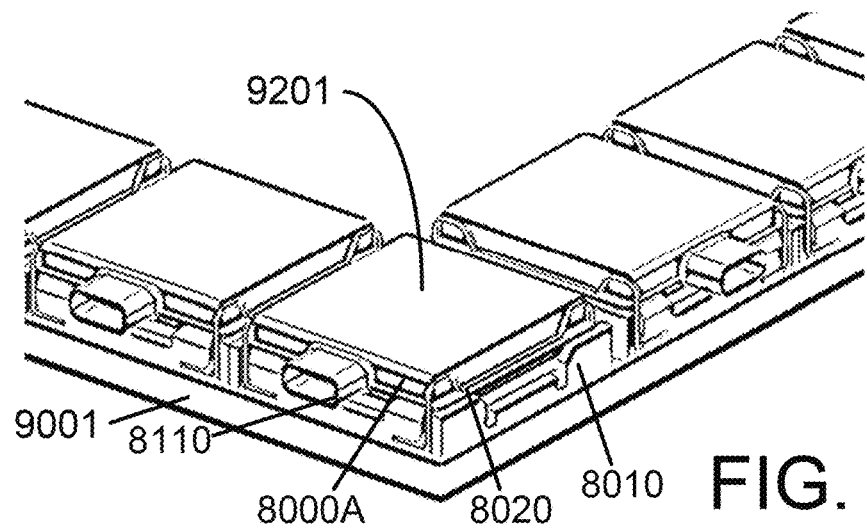
FIGS. 16A-16C show a method of releasing a sub-assembly from the packaged light engine chiplet of FIG. 15 according to an embodiment of the present invention.
Figure 16B:
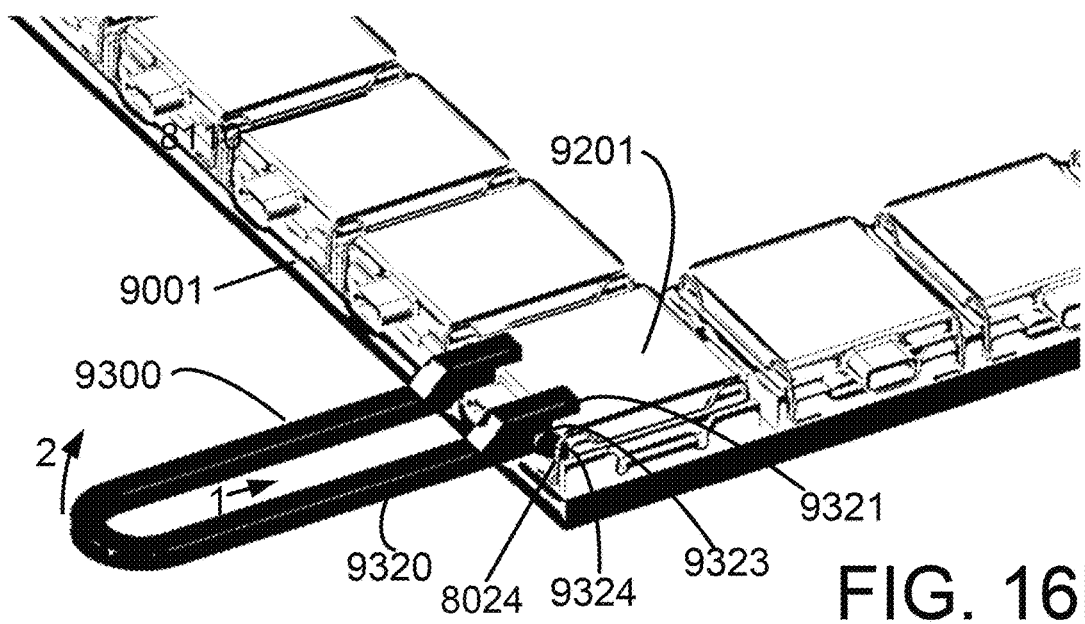
Figure 16C:
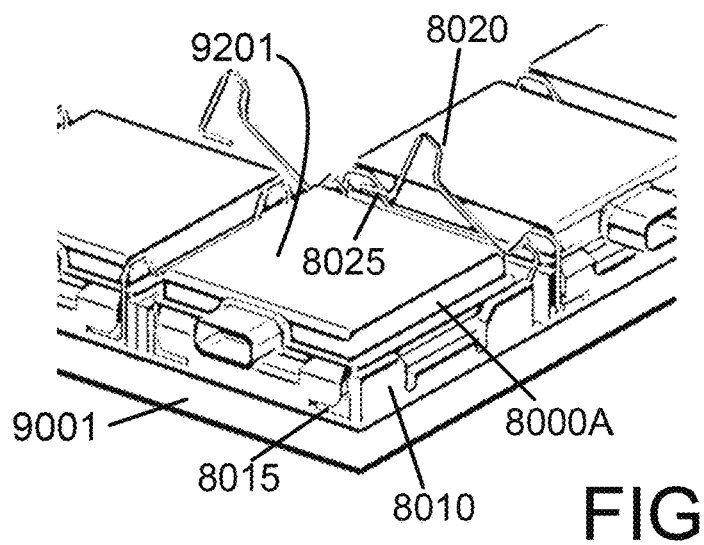

FIGS. 16A-16C show a method of releasing a sub-assembly from the packaged light engine chiplet of FIG. 15 according to an embodiment of the present invention. These diagrams are merely an example, which should not unduly limit the scope of the claims. One of ordinary skill in the art would recognize many variations, alternatives, and modifications. In a partial view of a co-packaged optical module as shown in FIG. 16A, multiple packaged light engine chiplets 9201 are mounted on a module substrate 9001 (see FIG. 11). Each packaged light engine chiplet 9201 includes a sub-assembly 8000A loaded in a socket base member 8010 disposed along peripheral edges of the module substrate 9001 with an optical port 8110 of the sub-assembly 8000A protruded outward the respective peripheral edge. As seen in FIG. 16A the socket base member 8010 of the packaged light engine chiplet 9201 is mounted in a corner site in the module substrate 9001. Substantially like the light engine chiplet 9200 shown in FIG. 15, two end sections 8025 of a metal wire 8020 are locked respectively into two front-wall bottom notches 8015 to clamp the sub-assembly 8000A in the socket base member 8010. Optionally, the sub-assembly 8000A can be released from the socket base member 8010 while the latter is still mated with the corner site in the module substrate 9001.

In FIG. 16B, a removal tool 9300 is provided with two arms 9320 connected in a U-shape piece. Each arm 9320 has a head member configured as a top tip 9321 connected to a side tip 9324. The top tip 9321 has an extra length beyond an end facet 9323 of the side tip 9324 and a height above the arm 9320. The side tip 9324 has a length extended sideway at a same height from the arm 9320. Optionally, the removal tool 9300 is configured to be applied to the front edge of a packaged light engine chiplet 9201 disposed in its mating site on the module substrate 9001 to release the sub-assembly 8000A clamped to the socket base member 8010. Optionally, the two arms 9320 are separated by a distance larger than a width of the optical port 8110 so that the two head members can be engaged directly with the front edge. As the removal tool 9300 is engaged along direction 1 toward the front edge of the chiplet 9201 to have the end facet 9323 against the front side edge, the side tip 9324 is allowed to be inserted with an extra length against the vertical section 8024 into the gap 8029 (see part B of FIG.

15). At the engaged position, the top tip 9321 of the respective head member has its bottom surface in touch with top surface of the lid member of the chiplet 9201. Then, the removal tool 9300 is lifted upward along direction 2 from the joint part of the U-shape piece with the head member being substantially against the top surface and the side edge of the lid member of the chiplet 9201. The lift motion allows the side tip 9324 to push the vertical section 8024 of the metal wire 8020 outward so that the end sections 8025 of the metal wire 8020 is released out of the locked position with the front-wall bottom notches 8015 of the socket base member 8010. FIG. 16C shows the released state of the metal wire 8020 with the end section 8025 being no longer locked with the front-wall bottom notch 8015. The sub-assembly 8000A of the light engine chiplet can then be released from the socket base member 8010 while the latter can remain being mated at a corresponding peripheral site of the module substrate 9001.

Figure 17:
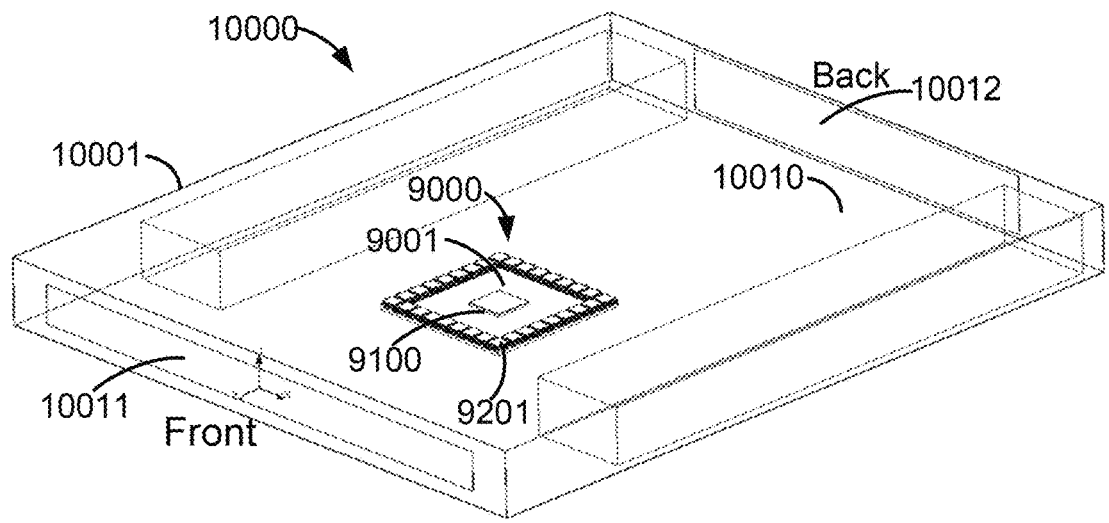
FIG. 17 is a schematic perspective view of a CPO switch module with 32 co-packaged optical-electrical modules in an 1 RU chassis according to an embodiment of the present invention.

In another alternative aspect, the present disclosure also provides an integrated heatsink to effectively dissipate substantial amount of heat generated by the co-packaged optical-electrical (CPO) switch module disclosed here. Therefore, the CPO switch module, in such compact package of one ASIC processor chip co-packaged with multiple light engines on a same switch substrate with minimum lateral dimension no greater than 110 mm can be operated properly within a standard system chassis. FIG. 17 is a schematic perspective view of a CPO switch module with up to 32 co-packaged optical-electrical modules in a 1 RU chassis according to an embodiment of the present invention. This diagram is merely an example, which should not unduly limit the scope of the claims. One of ordinary skill in the art would recognize many variations, alternatives, and modifications. Referring to FIG. 17, an optical switch rack unit 10000 in a 1 RU rack height chassis 10001 containing a CPO switch module 9000 of FIG. 11 is presented. The CPO switch module 9000 includes a processor ASIC chip 9100 co-packaged with up to 32 optical-electrical modules (light engine chiplets) commonly on a switch substrate 9001. Optionally, the switch substrate has a compact size intended for making the processor ASIC chip be as close as possible to the light engines with a minimum lateral dimension no greater than 110 mm. In the example shown in FIG. 17, the switch substrate has a square shape of about 100 mm×100 mm for mounting up to 32 light engine chiplets densely along its peripheral edges. Optionally, the switch substrate has a smaller size for mounting 16 light engine chiplets or has an even smaller size for mounting 8 light engine chiplets. Optionally, a multiple RU rack height chassis can be used to house the CPO switch module 9000.

In another example, the switch substrate can be a rectangular shape. The CPO switch module 9000 is disposed in a central region on a bottom plate 10010 of the 1 RU chassis 10001. Optionally, the CPO switch module 9000 is disposed closer to a front side 10011 of the 1 RU chassis 10001 relative to aback side 10012. Optionally, the CPO switch module 9000 includes the processor ASIC chip 9100 in a single die of ~800 mm² for supporting data switching throughput of 51.2 Tbit/s with up to 32 co-packaged light engine chiplets disposed around periphery of a square-shaped switch substrate 9001. Optionally, each of the 32 light engine chiplets 9201 is formed on a sub-module substrate of about 10 mm×10 mm and yielding 1.6 Tbit/s data capacity per light engine. Optionally, the CPO switch module 9000 can include a smaller switch substrate for mounting 16 co-packaged light engines while each light engine yielding 3.2 Tbit/s capacity to still provide total 51.2 Tbit/s throughput. Optionally, the CPO switch module 9000 has a smaller switch substrate that even just mounts 8 light engine chiplets, while each having 6.4 Tbit/s capacity to give total 51.2 Tbit/s throughput. In general, data rate per chiplet can increase the same fractional amount as the number of chiplets mounted on the switch substrate changes. Optionally, the front side 10011 of the 1 RU chassis 10001 may include multiple optical connector sockets. Optionally, the back side 10012 of the 1 RU chassis 10001 may be installed with multiple electrical-powered fans for sucking heated air inside the chassis for convection cooling of the switch rack unit 10000. Optionally, the 1 RU chassis 10001 includes a power supply.

In the example of FIG. 17, the CPO switch module 9000 includes 32 co-packaged light engines each providing 16 wavelength lanes with 100 G/k in 56 Gbaud per lane to yield 1.6 Tbit/s capacity. Each light engine includes a transimpedance amplifier per lane, an integrated modulator driver plus termination per lane, silicon photonics circuits, microcontroller and miscellaneous electronics, digital signal processing and interface with Extra-Short-Reach (XSR) or Physical Code Sublayer (PCS) or Physical Medium Attachment (PMA) layer or PAM Backplane Reach, total consuming 16.15 W. Total 32 light engines then consume ~517 W power. For handling and controlling the 32 co-packaged light engines (e.g., 9201-9232), a single processor ASIC chip 9100 will consume ~550 W power. The total power of 1067 W for operating the CPO switch module 9000 generates huge amount of heat. Mere convection cooling is not enough to maintain module temperatures in a controlled safe range to meet requirement of keeping a minimum bit-error-rate for the host FEC to correct to $10^{-12}$ BER. Extra heat dissipation effort, such as adding a properly designed heatsink, needs to be implemented.

Figure 18:
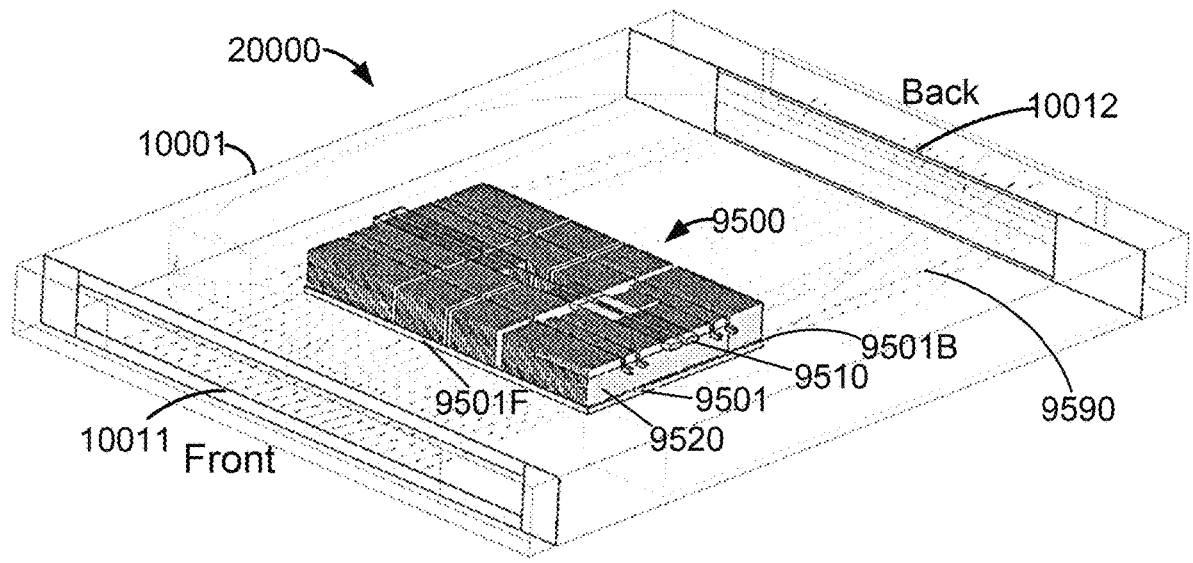
FIG. 18 is a schematic perspective view of an integrated heatsink disposed on the CPO switch module in the 1 RU chassis according to an embodiment of the present invention.

FIG. 18 is a schematic perspective view of an integrated heatsink disposed on the CPO switch module in the 1 RU chassis according to an embodiment of the present invention. This diagram is merely an example, which should not unduly limit the scope of the claims. One of ordinary skill in the art would recognize many variations, alternatives, and modifications. Referring to the FIG. 18, an integrated heatsink 9500 is configured to directly attach a base plate 9501 on the CPO switch module 9000 disposed in the 1 RU chassis 10001 (as seen in FIG. 17) to obtain a (cooled version of) switch rack unit 20000. The integrated heatsink 9500 is designed to work in an environment with a certain inlet ambient temperature, for example at 35° C., under an outlet air flow at a speed of, for example, 150 cfm, from the front side 10011 to the back side 10012 of the 1 RU chassis 10001 generated by multiple electrical fans. Optionally, the electrical fans can be mounted at the back side 10012 of the chassis 10001 (not explicitly shown in the figure). Optionally, the front side 10011 is configured to install multiple optical connector sockets allowing optical connectors to plug in as part of optical I/O interface of the 1 RU chassis. The front side 10011 includes a plurality of through holes as air inlets allowing cold air from ambient to form a forced air flow 9590 (schematically indicated by the dashed lines in the figure) into the 1 RU chassis driven by the multiple electrical fans at the back side 10012.

Referring to FIG. 18, in an example, the base plate 9501 of the integrated heatsink 9500 has a rectangular shape with a plurality of fin structures 9520 formed thereon all having a fin-plane in parallel to an axial direction of the forced air flow from the front side 10011 to the back side 10012. Optionally, the rectangular shaped base plate 9501 is placed on the CPO switch module on a square shaped switch substrate in a manner that is center aligned and edge-edge in parallel. The front edge 9501F of the base plate 9501 is parallel to the front peripheral edge of the switch substrate supporting the CPO switch module 9000 (see FIG. 17). The front edge 9501F of the base plate 9501 also is in parallel facing the front side 10011 of the chassis 10001 to receive and the back edge 9501B of the base plate 9501 is in parallel facing the back side 10012 of the chassis 10001. Optionally, the plurality of fin structures 9520 includes straight fins, as shown in FIG. 18. Optionally, the plurality of fin structures includes flared fins (not shown). Either the straight fin or the flared fin includes a fin-plane laid in a direction parallel to the axial direction perpendicularly from the front side 10011 to the back side 10012, so that the forced air flow along the axial direction in this chassis package configuration can be substantially maintained at a certain flow rate to drive convection heat transfer. Optionally, the fin structures 9520 has an optimized height-length aspect ratio associated with a certain flow rate of the forced air flow in chassis. In another example, the plurality of fin structures includes pin fins (not shown). Optionally, other fin arrangements may also be suitable to provide heat dissipation requirement for specific applications. The width of the base plate 9501 of the integrated heatsink 9500 is made to be larger than the length, allowing a bigger range of reception of flowing air from the front side 10011 while releasing the heated air in a shorter path towards the back side 10012. Optionally, both the width and the length of the base plate 9501 is made bigger than the width and length of the CPO switch module underneath (not visible in FIG. 18).

Additionally, the integrated heatsink 9500 includes multiple thermal conductors 9510 embedded in several trenches across the fin structures 9520. Some trenches are formed shallow in depth and, optionally, perpendicularly across some fin structures. Some other trenches are formed deep in depth down to the base plate and, optionally, either along or perpendicularly across some fin structures. Optionally, the thermal conductors 9510 include respective bottom horizontal portions being brazed on the base plate 9501 at regions that are superimposed to corresponding hot regions of the CPO switch module underneath the base plate 9501, so that these thermal conductors can effectively enhance heat dissipation through conduction. Optionally, the thermal conductors 9510 include respective top portions substantially laid in some trenches shallow in depth perpendicularly to some fin structures 9520, allowing them to have largest cross-section areas relative to the flowing air to take away the heat conducted from them to the fin structures 9520, enhancing the thermal performance of the integrated heatsink 9500. Optionally, the thermal conductors 9510 are provided as heat pipes that each can be made hollow inside to carry coolant fluid circulating in a closed loop to enhance cooling power. Optionally, the base plate 9501 as well as the plurality of fin structures 9520 are made by conductive aluminum alloys or copper (Cu). Optionally, the thermal conductors 9510 are provided with solid material with high thermal conductivity, such as Cu.

Figure 19:
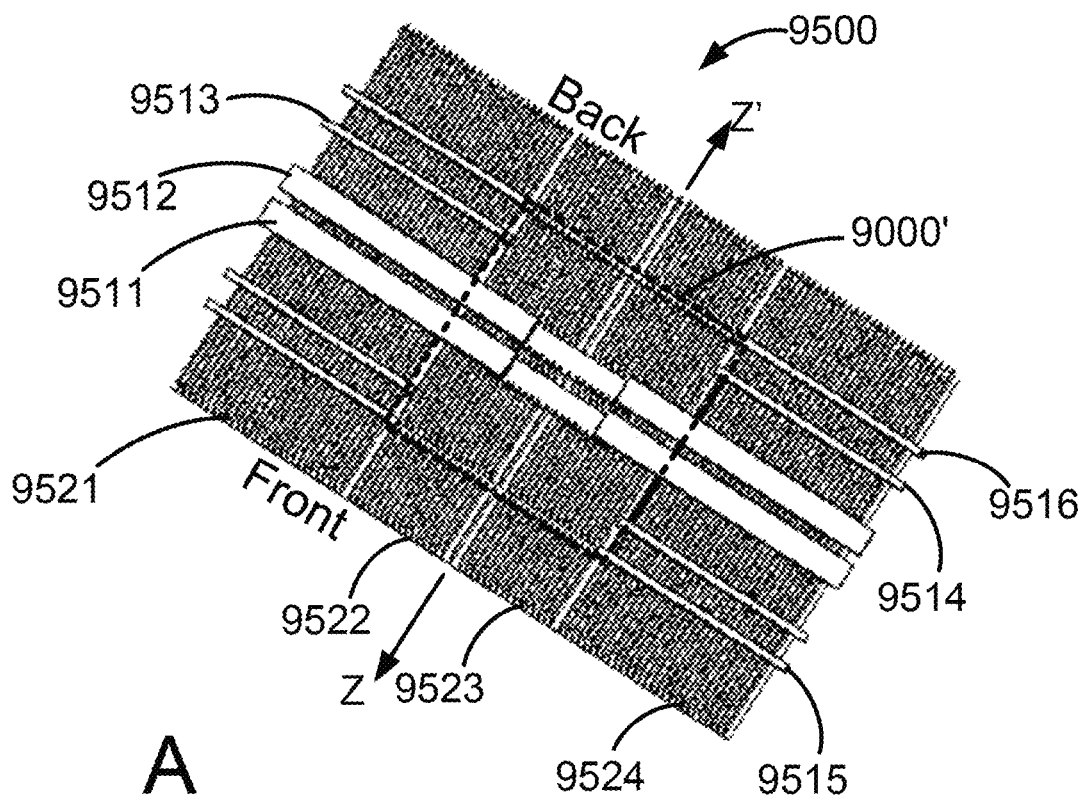
FIG. 19 is a schematic diagram of (A) a top view of the integrated heatsink with embedded heat pipes and (B) a perspective view of the heat pipes for dissipating heat out of the CPO switch module with 32 co-packaged optical-electrical modules according to an embodiment of the present invention.
Figure 19:
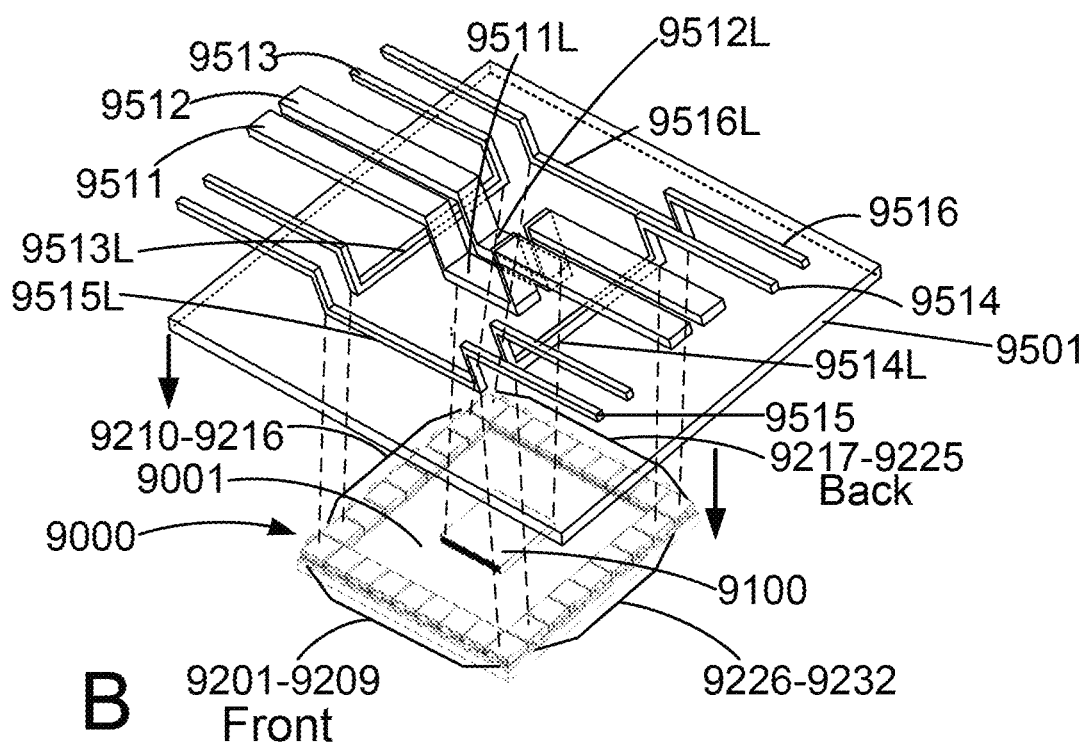

FIG. 19 is a schematic diagram of (A) atop view of the integrated heatsink with embedded heat pipes and (B) a perspective view of the heat pipes for dissipating heat out of the CPO switch module with 32 co-packaged optical-electrical modules according to an embodiment of the present invention. This diagram is merely an example, which should not unduly limit the scope of the claims. One of ordinary skill in the art would recognize many variations, alternatives, and modifications. Referring to part A of FIG. 19, a top view of the integrated heatsink 9500 reveals several sections 9521, 9522, 9523, 9524 of the fin structures 9520 (see FIG. 17) in a symmetric fashion relative to an axis ZZ' along the axial (front-to-back) direction to which all fin structures are in parallel. A dashed square 9000' represents a designated area projected from the CPO switch module 9000 (see FIG. 17) underneath the integrated heatsink 9500, with the virtual boundaries of 9000' are substantially superimposed on peripheral edges of the switch substrate for supporting the multiple co-packaged light engine chiplets 9201 (see FIG. 17).

Referring to part A of FIG. 19, a first section 9521 and a fourth section 9524 are two side sections primarily over regions beyond the designated area 9000'. A second section 9522 and a third section 9523 are two central sections, each covering at least half of the designated area 9000' with extra portions extended in both front and back. Between the first section 9521 and the second section 9522 or between the third section 9523 and the fourth section 9524, a boundary forms along one of virtual boundaries of the designated area 9000' in a form of a trench or cavity between adjacent fins with at least one fin being removed. A boundary between the second section 9522 and the third section 9523 is also a cavity with one or two fins being removed.

Referring to part A of FIG. 19 again, the fin structures include multiple trenches substantially in directions parallel or perpendicular to the fins and a central cavity region of the base plate without fins. In these trenches or cavity region multiple thermal conductors 9510 including heat pipes 9511, 9512, 9513, 9514, 9515, 9516 are embedded. Each heat pipe includes multiple shaped portions, in general, a pair of top horizontal portions, a bottom horizontal portion, and a pair of vertical portions that connect the pair of top horizontal portions with the bottom horizontal portion. The heights of the vertical portions are no greater than the height of the fin structures as the top horizontal portions are embedded in the respective trenches of the fin structures. Though the vertical portions are not directly visible in the part A of the figure, the horizontal portions can be clearly seen embedded in the fin structures.

In particular, the top horizontal portions of the heat pipes are laid perpendicular to the axial direction ZZ' along the trenches with shallow depths across multiple rows of fins at least in either the first section 9521 or the fourth section 9524 of fin structures. The top horizontal portions of the first two heat pipes 9511 and 9512 are extended beyond the first and second sections 9521 and 9524 of fin structures partially into the second section 9522 and the third section 9523 of fin structures. The bottom horizontal portions 9511L and 9512L (see part B of the figure) of the first two heat pipes 9511 and 9512 are disposed into the central cavity region within the second section 9522 and third section 9523 on the base plate. The central cavity region of the base plate is substantially center aligned with the processor ASIC chip at the central region of the CPO switch module. Optionally, the width of each of the first two heat pipes 9511 and 9512 is substantially the same throughout its length. Optionally, the total width of the first two heat pipes 9511 and 9512 is comparable to that of the processor ASIC chip of the CPO switch module 9000 underneath the base plate. Optionally, one heat pipe of a same shape with double width can replace the first two heat pipes 9511 and 9512.

The third heat pipe 9513 has a pair of top horizontal portions embedded in the trenches shallow in depth located totally within the first section 9521 of fin structures. The pair of top horizontal portions of the third heat pipe 9513 are respectively embedded in two trenches parallel with shallow depths. One trench is located on a side of the first heat pipe 9511 near the front edge 9501F. Another trench is located on a side of the second heat pipe 9512 near the back edge 9501B. The third heat pipe 9513 has its bottom horizontal portion 9513L (see part B of the figure) embedded in a trench with deep depth down to the base plate along the boundary between the first section 9521 and the second section 9522 of fin structures (which is also a virtual boundary of the designated area 9000').

The fourth heat pipe 9514 is substantially symmetrical to the third heat pipe 9513 relative to the axis that bisects the second section 9522 and the third section 9523, being embedded in the trenches in the fourth section 9524 of fin structures. The two top horizontal portions of the fourth heat pipe 9514 are respectively laid in two trenches parallel with shallow depths in the fourth section 9524 of fin structures. One trench is located on a side of the first heat pipe 9511 near the front edge 9501F. Another trench is located on a side of the second heat pipe 9512 near the back edge 9501B. The bottom horizontal portion 9514L of the fourth heat pipe 9514 is embedded in a trench with a deep depth down to the base plate along the boundary between the third section 9523 and the fourth section 9524 of fin structures (which is also a virtual boundary of the designated area 9000').

The two top horizontal portions of the fifth heat pipe 9515 are embedded respectively in one trench with shallow depth perpendicularly across the first section 9521 and another trench with shallow depth perpendicularly across the fourth section 9524, both being more closer to the front edge 9501F than the top horizontal portions of both the third heat pipe 9513 and the fourth heat pipe 9514. The bottom horizontal portion 9515L of the fifth heat pipe 9515 is disposed into a trench deeply down to the base plate along one virtual boundary of the designated area 9000', which is aligned with the two top horizontal portions in a same direction across the fin structures and substantially superimposed with a front peripheral edge of the switch substrate facing the front edge 9501F.

The sixth heat pipe 9516 is substantially in a symmetric position versus the fifth heat pipe 9515 relative to a central line crossing the fin structures 9500 between the first two heat pipes 9511 and 9512. The bottom horizontal portion 9516L of the sixth heat pipe 9516 is disposed into a deep trench down to the base plate along another virtual boundary of the designated area 9000', which is aligned with the two top horizontal portions in a same direction across the fin structures and substantially superimposed with a back peripheral edge of the switch substrate facing the back edge 9501B of the integrated heatsink 9500.

Referring to part B of FIG. 19, the shaped portions of the multiple heat pipes 9511, 9512, 9513, 9514, 9515, and 9516 are extracted out of the fin structures 9520. Without fin structures to block views, respective bottom horizontal portions 9511L, 9512L, 9513L, 9514L, 9515L, and 9516L of the multiple heat pipes are shown being brazed onto the base plate 9501. Also, corresponding vertical portions that connect the top horizontal portions to the bottom horizontal portions are revealed. In addition, for illustration purpose, a CPO switch module 9000 is added below the base plate 9501 to indicate that the corresponding bottom horizontal portions of the heat pipes are superimposed with either the processor ASIC chip 9100 at the central region or the light engine chiplets 9201-9232 along peripheral edges of switch substrate of the CPO switch module 9000. In particular, the first two bottom horizontal portions 9511L and 9512L are designed to be superimposed on the processor ASIC chip 9100 at the central region of the CPO switch module 9000. The third bottom horizontal portion 9513L is designed to be superimposed with seven light engine chiplets 9210-9216 along one side peripheral edge of the switch substrate. The fourth bottom horizontal portion 9514L is designed to be superimposed on seven light engine chiplets 9226-9232 along an opposing one side peripheral edge of the switch substrate. The fifth bottom horizontal portion 9515L is designed to be superimposed on the light engine chiplets 9201-9209 disposed along a front peripheral edge of the switch substrate. Additionally, the sixth bottom horizontal portion 9516L is designed to be superimposed on the light engine chiplets 9217-9225 disposed along the back peripheral edge of the switch substrate. As the key components of the CPO switch module 9000, the processor ASIC chip 9100 and all the co-packaged light engine chiplets 9201-9232 are major heat spots during operation. Thus, in addition to the thermal conduction effect provided by the fin structures on the base plate 9501 in combination with the thermal convection provided by the forced air flow 9590 (see FIG. 18), all the bottom horizontal portions of these heat pipes that are superimposed on the respective heat spots of the CPO switch module can substantially improve heat dissipation through enhanced thermal conduction therefrom, thereby improving overall performance of the CPO switch module 9000.

Figure 20:
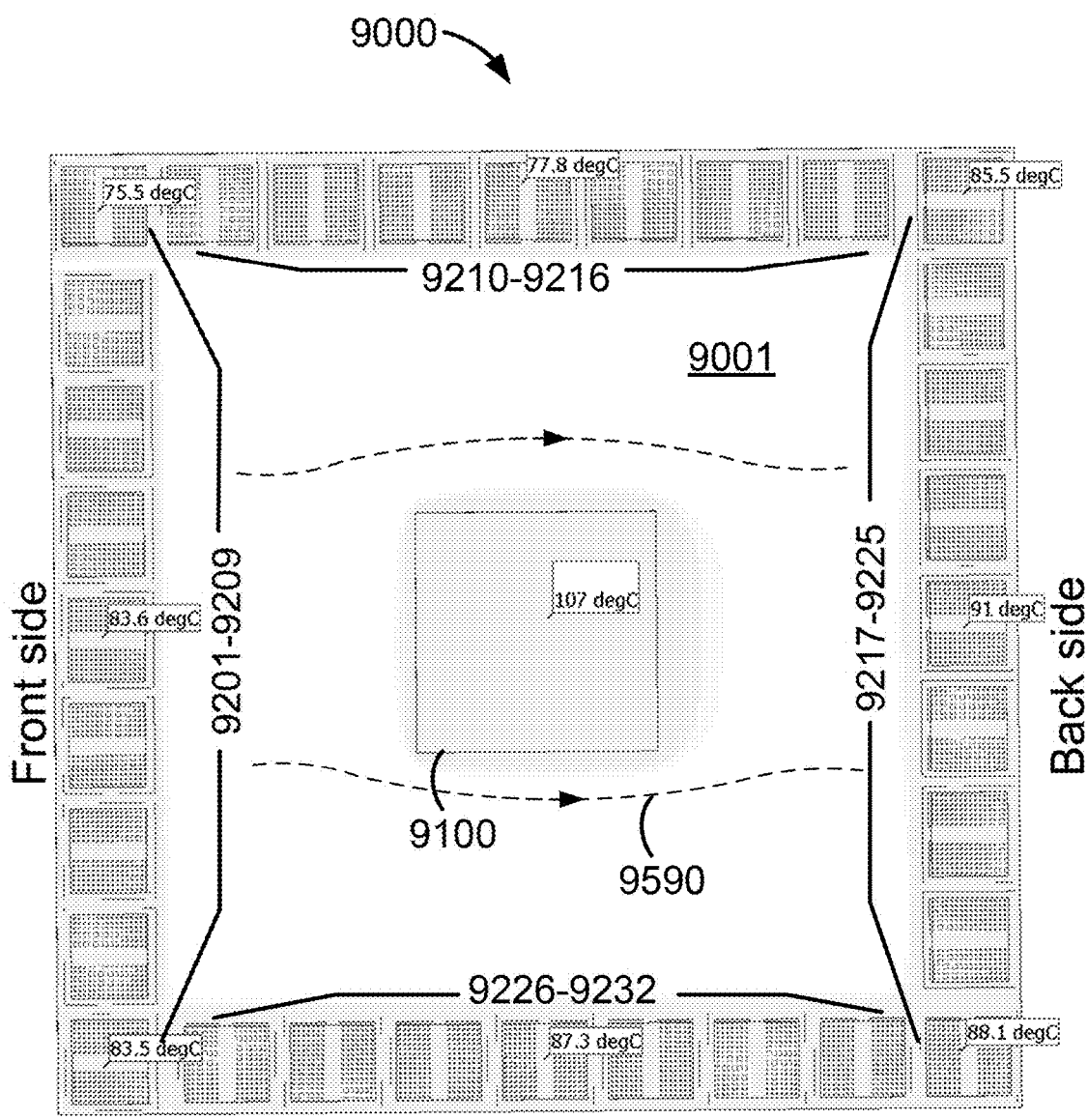
FIG. 20 is an exemplary diagram of a thermal profile of the CPO switch module with 32 co-package optical-electrical modules cooled by the integrated heatsink with embedded heat pipes according to an embodiment of the present invention.

In another embodiment, as enhanced thermal conduction is provided through the multiple heat pipes, 9511-9516, these heat pipes can be configured to be made from a solid material with good thermal conductivity such as copper or others or be made hollow inside in a closed loop to allow a coolant fluid circulating through each heat pipe to additionally improve thermal conduction. As a result of a combination of disposing the integrated heatsink 9500 with a plurality of fin structures 9520 multiple embedded heat pipes 9510 on the CPO switch module and applying the forced air flow along the axial direction though the 1 RU chassis, enormous amount of heat can be properly released during operation of the CPO switch module. In an example, enormous amount of heat generated by the CPO switch module during its operation can be properly dissipated despite of using a high-speed high-power processor ASIC chip to handle 32 or more light engines co-packaged on a single compact switch substrate for data communication operation with XSR/PCS/PMA/POR or equivalent protocols. FIG. 20 is an exemplary diagram of a thermal profile of the CPO switch module cooled by the integrated heatsink with embedded heat pipes according to an embodiment of the present invention.

Using the CPO switch module 9000 with 32 co-packaged optical-electrical modules as an example, a thermal profile of the processor ASIC chip 9100 and 32 co-packaged light engines 9201-9232 is provided under an exemplary environmental condition. The environmental condition includes a disposition of the integrated heatsink 9500 with multiple embedded heat pipes (FIG. 18, FIG. 19) disposed on the CPO switch module and an establishment of a forced air flow of a certain flow rate under a certain ambient temperature within the 1 RU chassis. Referring to FIG. 20, a thermal simulation result is presented assuming that the CPO switch module 9000 with a processor ASIC chip 9100 and 32 co-packaged light engine chiplets 9201-9232 are installed in the 1 RU chassis 10001 (see FIG. 17 and FIG. 18) with air flowing speed set at 150 cfm and inlet ambient temperature of 35° C. During a normal operation condition, the CPO switch module 9000 consumes total power of about 1068 W, with ASIC chip 9100 being operated at about 550 W and each light engine chiplet (9201-9232) consuming about 16.15 W. As the processor ASIC chip 9100 is integrated to provide switching for data communication operation through all 32 light engines on the same switch substrate 9001, it releases more heat than light engine chiplets 9201-9232 combined. Yet, under the cooling effect of the integrated heatsink 9500 in combination of thermal conduction via multiple embedded heat pipes in multiple sections of fin structures (see FIG. 19) and thermal convection via the forced air flow 9590 from the front side 10011 to the back side 10012 of the 1 RU chassis 10001 (see FIG. 18), the ASIC chip 9100 is controlled to a temperature of about 107° C. and the light engine 9201-9232) are controlled to a temperature ranging from about 75.5° C. to about 91° C. depending on different locations around the periphery of the switch substrate 9001 relative to specific side of the process ASIC chip 9100 in the central region of the switch substrate 9001.

Referring to FIG. 20, the left (of the figure) peripheral edge of the CPO switch module 9000 is considered to be a front peripheral edge facing the front side 10011 of the 1 RU chassis 10001 and the right (of the figure) peripheral edge is considered to be a back peripheral edge closer to the back side 10012 of the chassis. In the simulation, the forced air flow 9590 is set to a fixed speed of 150 cfm with flow direction from the front toward the back and an inlet ambient temperature in the 1 RU chassis is set at 35° C. As the result, the light engine chiplets 9201-9209 disposed at the left (front) peripheral edge are in a relatively lower temperature range from about 75.5° C. to about 83.6° C. and the light engine chiplets 9217-9225 disposed at the right (back) peripheral edge are in a relatively higher temperature range from about 85.5° C. to about 91° C. Of course, specific thermal profiles will be different for a CPO switch module with a different processor ASIC chip co-packaged with 16 light engine chiplets or another CPO switch module with another processor ASIC chip and co-packaged light engines respectively in different configurations in terms of chip integration, functionality, power consumption, operation condition, etc. Yet, the combination of providing an integrated heatsink with multiple shaped heat pipes embedded in multiple sections of fin structures, forming thermal contacts between the shaped heat pipes and heat spots of the CPO module, circulating coolant fluid within a closed loop for each of the multiple shaped heat pipes, and forced air flow with a certain flow speed through the multiple sections of fin structures, provide sufficient heat dissipation to maintain proper operation for the compact CPO module with total data throughput of 51.2 Tbit/s.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. An integrated heatsink for a co-packaged optical-electrical module comprising:
    a base plate attached on a top of the co-packaged optical-electrical module including a processor ASIC chip at a central region of a switch substrate with multiple light engine chiplets commonly mounted along peripheral edges of the switch substrate, the base plate being center-aligned with the central region of the switch substrate and edge-extended parallelly beyond the peripheral edges of the switch substrate in all directions;
    a plurality of fin structures extended upward from the base plate except for a central cavity region, each of the plurality of fin structures having a fin-plane extended along an axial direction from a front edge to a back edge of the base plate except for some trenches shallow in depth across some of the plurality of fin structures and some other trenches deep in depth down to the base plate either along or across some of the plurality of fin structures; and
    multiple thermal conductors embedded in the some trenches shallow in depth and the some other trenches deep in depth in the plurality of fin structures, each of the thermal conductors including a pair of top horizontal portions laid in a corresponding pair of the some trenches shallow in depth across some of the plurality of fin structures, at least one bottom horizontal portion laid in the central cavity region of the base plate or in a corresponding one of the some other trenches deep in depth down to the base plate along or across some of the plurality of fin structures, and a pair of vertical portions to connect the pair of top horizontal portions and the at least one bottom horizontal portion, the at least one bottom horizontal portion being brazed to a part of the base plate which is superimposed on either the processor ASIC chip at the central region of the switch substrate or the multiple light engine chiplets mounted along one of the peripheral edges of the switch substrate.

2. The integrated heatsink of claim 1 wherein the switch substrate is a square shape to support 8, or 16, or up to 32 of the light engine chiplets co-packaged densely along the peripheral edges, each edge being packed with 2 of the 8, or 4 of the 16, or 8 of the 32 of the light engine chiplets surrounding the processor ASIC chip at the central region, the base plate is a rectangular shape with the front edge or the back edge of the base plate in parallel to a front one of the peripheral edges or a back one of the peripheral edges of the switch substrate.

3. The integrated heatsink of claim 2 wherein the plurality of fin structures comprises multiple sections including:
    a first section formed on the base plate from the front edge to the back edge and from a first side edge to a first boundary projected from a side one of the peripheral edges of the switch substrate under the base plate;
    a second section formed on the base plate from the front edge to the back edge between the first boundary and a central boundary along the axial direction over respective two projected half areas of the switch substrate;
    a third section formed on the base plate from the front edge to the back edge between the central boundary and a second boundary projected from an opposing side one of the peripheral edges of the switch substrate under the base plate, the third section and the second section being symmetrical relative to the central boundary; and
    a fourth section formed on the base plate from the front edge to the back edge and from the second boundary to a second side edge opposing to the first side edge.

4. The integrated heatsink of claim 3 wherein the multiple thermal conductors comprise a first heat pipe and a second heat pipe both laid substantially perpendicularly crossing the plurality of fin structures, the first heat pipe being located at a side of a middle line of the plurality of fin structures closer to a first extended line projected from the front one of the peripheral edges of the switch substrate and the second heat pipe being located next to the first heat pipe at one side of the middle line closer to a second extended line projected from the back one of the peripheral edges of the switch substrate, each of the first heat pipe and the second heat pipe including:

each of a first pair of the pair of top horizontal portions embedded in a respective one of the corresponding pair of the some trenches shallow in depth, one of the corresponding pair of the some trenches shallow in depth being located across the first section entirely and the second section partially and another of the corresponding pair of the some trenches shallow in depth being located across the third section partially and the fourth section entirely;

a first bottom horizontal portion of the at least one bottom horizontal portion being laid in the central cavity region in touch with the base plate; and each of a first pair of the pair of vertical portions connecting a respective one of the first pair of the pair of top horizontal portions with the first bottom horizontal portion.

5. The integrated heatsink of claim 4 wherein the first heat pipe has a first width, and the second heat pipe has a second width, a combined width including the first width and the second width plus a width of any gap between the first heat pipe and the second heat pipe is a same as a lateral dimension of the central cavity region substantially superimposed on the processor ASIC chip at the central region on the switch substrate.

6. The integrated heatsink of claim 4 wherein the multiple thermal conductors further comprise a third heat pipe including:

a second pair of the pair of top horizontal portions embedded in the corresponding pair of the some trenches shallow in depth substantially perpendicularly crossing the first section only, one of the corresponding pair of the some trenches shallow in depth being located at one side of the first heat pipe closer to but within the first extended line in the first section and another of the corresponding pair of the some trenches shallow in depth being located at one side of the second heat pipe closer to but within the second extended line in the first section;

a second bottom horizontal portion of the at least one bottom horizontal portion being laid in the corresponding one of the some other trenches deep in depth in touch with the base plate along part of the first boundary within a range between the first extended line and the second extended line in the first section, and each of a second pair of the pair of vertical portions connecting a respective one of the second pair of the pair of top horizontal portions with the second bottom horizontal portion.

7. The integrated heatsink of claim 6 wherein the second bottom horizontal portion comprises a length in touch with the base plate substantially superimposed on the multiple light engine chiplets mounted along the side one of the peripheral edges of the switch substrate.

8. The integrated heatsink of claim 4 wherein the multiple thermal conductors further comprise a fourth heat pipe including:

a third pair of the pair of top horizontal portions embedded in the corresponding pair of the some trenches shallow in depth substantially perpendicularly crossing the fourth section only, one of the corresponding pair of the some trenches shallow in depth being located at one side of the first heat pipe closer to but within the first extended line in the fourth section and another of the corresponding pair of the some trenches shallow in depth being located at one side of the second heat pipe closer to but within the second extended line in the fourth section;

a third bottom horizontal portion of the at least one bottom horizontal portion being laid in the corresponding one of the some other trenches deep in depth in touch with the base plate along part of the second boundary within a range between the first extended line and the second extended line in the fourth section, and each of a third pair of the pair of vertical portions connecting a respective one of the third pair of the pair of top horizontal portions with the third bottom horizontal portion.

9. The integrated heatsink of claim 8 wherein the third bottom horizontal portion comprises a length in touch with the base plate substantially superimposed on the multiple light engine chiplets mounted along the opposing side one of the peripheral edges of the switch substrate.

10. The integrated heatsink of claim 4 wherein the multiple thermal conductors further comprise a fifth heat pipe and a sixth heat pipe laid respectively along the first extended line and the second extended line perpendicularly crossing the plurality of fin structures, either the fifth heat pipe or the sixth heat pipe including:

each of a fourth pair of the pair of top horizontal portions embedded in a respective one of the corresponding pair of the some trenches shallow in depth in the first section and the fourth section;

a fourth bottom horizontal portion of the at least one bottom horizontal portion being laid in the corresponding one of the some other trenches deep in depth in touch with the base plate along either the first extended line in the second section and the third section or the second extended line in the second section and the third section, and each of a fourth pair of the pair of vertical portions connecting a respective one of the fourth pair of the pair of top horizontal portions with the fourth bottom horizontal portion.

11. The integrated heatsink of claim 10 wherein the fourth bottom horizontal portion comprises a length in touch with the base plate substantially superimposed on the multiple light engine chiplets mounted along either the front one of the peripheral edges of the switch substrate or the back one of the peripheral edges of the switch substrate.

12. The integrated heatsink of claim 1 wherein the plurality of fin structures comprises straight fins or flared fins with fin-planes extended on the base plate and oriented along the axial direction perpendicular to the front edge and the back edge.

13. The integrated heatsink of claim 1 wherein each of the multiple thermal conductors comprises a single piece of solid material selected from copper or other material with high-thermal conductivity.

14. The integrated heatsink of claim 1 wherein each of the multiple thermal conductors comprises a heat pipe with a coolant fluid circulated within.

15. The integrated heatsink of claim 1 wherein the processor ASIC chip comprises a digital signal processing (DSP) chip through a CMOS process to provide a host interface to perform data interconnect via extra-short-reach (XSR) protocol and a line interface to support PAM optical reach (POR) protocol.

16. The integrated heatsink of claim 1 wherein each of the multiple light engine chiplets comprises a silicon photonics chip coupled to multiple laser chips, transimpedance amplifier chips, and modulator drivers and configured as a multi-wavelength transceiver to support multi-channel data communication under PAM-N modulation format with a total of 1.6 Tbit/s or higher data capacity.

17. A switch module based on co-packaged optics comprising:
a rack chassis with a bottom plate extended from a front side to a back side;
multiple electrically powered fans installed on the back side being configured to generate a forced air flow from the front side to the back side with a certain flow rate;
a co-packaged optical-electrical module including a processor ASIC chip at a central region of a switch substrate with multiple light engine chiplets commonly mounted along peripheral edges of the switch substrate mounted on the bottom plate;
a base plate attached on a top of the co-packaged optical-electrical module, the base plate being center-aligned with the central region of the switch substrate and edge-extended parallelly beyond the peripheral edges of the switch substrate in all directions;
a plurality of fin structures extended upward from the base plate except for a central cavity region, each of the plurality of fin structures having a fin-plane extended along an axial direction from a front edge to a back edge of the base plate except for some trenches shallow in depth across some of the plurality of fin structures and some other trenches deep in depth down to the base plate either along or across some of the plurality of fin structures; and
multiple thermal conductors embedded in the some trenches shallow in depth and the some other trenches deep in depth in the plurality of fin structures, each of the thermal conductors including a pair of top horizontal portions laid in a corresponding pair of the some trenches shallow in depth across some of the plurality of fin structures, at least one bottom horizontal portion laid in the central cavity region of the base plate or in a corresponding one of the some other trenches deep in depth down to the base plate along or across some of the plurality of fin structures, and a pair of vertical portions to connect the pair of top horizontal portions and the at least one bottom horizontal portion, the at least one bottom horizontal portion being brazed to a part of the base plate which is superimposed on either the processor ASIC chip at the central region of the switch substrate or the multiple light engine chiplets mounted along one of the peripheral edges of the switch substrate.

18. A method of cooling an optical-electrical switch in rack package comprising:
providing a rack chassis with a bottom plate extended from a front side to a back side;
generating a forced air flow from the front side to the back side in the rack chassis;
mounting a co-packaged optical-electrical module on the bottom plate, the co-packaged optical-electrical module including a processor ASIC chip at a central region of a switch substrate with multiple light engine chiplets commonly mounted along peripheral edges of the switch substrate;
disposing an integrated heatsink on a top of the co-packaged optical-electrical module in the rack chassis, the integrated heatsink comprising,
a base plate attached to the top of the co-packaged optical-electrical module, the base plate being center-aligned with the central region of the switch substrate and edge-extended parallelly beyond the peripheral edges of the switch substrate in all directions;
a plurality of fin structures extended upward from the base plate except for a central cavity, each of the plurality of fin structures having a fin-plane extended along an axial direction from a front edge to a back edge of the base plate except for some trenches shallow in depth across some of the plurality of fin structures and some other trenches deep in depth down to the base plate either along or across some of the plurality of fin structures; and
multiple thermal conductors embedded in the some trenches shallow in depth and the some other trenches deep in depth in the plurality of fin structures, each of the multiple thermal conductors including a pair of top horizontal portions laid in a corresponding pair of the some trenches shallow in depth across some of the plurality of fin structures, at least one bottom horizontal portion laid in the central cavity of the base plate or in a corresponding one of the some other trenches deep in depth down to the base plate along or across some of the plurality of fin structures, and a pair of vertical portions to connect the pair of top horizontal portions and the at least one bottom horizontal portion, the at least one bottom horizontal portion being brazed to a part of the base plate which is superimposed on either the processor ASIC chip at the central region of the switch substrate or the multiple light engine chiplets mounted along one of the peripheral edges of the switch substrate.

19. The method of claim 18 wherein the multiple thermal conductors are heat pipes, each of the heat pipes configured to be hollow inside to allow a coolant fluid to be circulated therein.

* * * * *